(12) United States Patent
Huang et al.

(10) Patent No.: US 11,749,947 B2
(45) Date of Patent: Sep. 5, 2023

(54) ELECTRICAL CONNECTOR WITH GROUND TERMINALS AND SHIELDING GROUND TERMINALS AROUND SIGNAL TERMINALS

(71) Applicants: Dongguan Luxshare Technologies Co., Ltd, Dongguan (CN); HUAWEI TECHNOLOGIES CO., LTD., Shenzhen (CN)

(72) Inventors: Bin Huang, Dongguan (CN); Ming Li, Dongguan (CN); RongZhe Guo, Dongguan (CN); HongJi Chen, Dongguan (CN); KaiDe Wang, Dongguan (CN); Tao Zeng, Shenzhen (CN); ShuYao Shen, Shenzhen (CN)

(73) Assignees: Dongguan Luxshare Technologies Co., Ltd, Dongguan (CN); HUAWEI TECHNOLOGIES CO., LTD., Shenzhen (CN)

(*) Notice: Subject to any disclaimer, the term of this patent is extended or adjusted under 35 U.S.C. 154(b) by 19 days.

(21) Appl. No.: 17/368,794

(22) Filed: Jul. 6, 2021

(65) Prior Publication Data

US 2022/0115816 A1    Apr. 14, 2022

(30) Foreign Application Priority Data

Oct. 9, 2020  (CN) .......................... 202011072601.5

(51) Int. Cl.
*H01R 13/6461* (2011.01)
*H01R 12/75* (2011.01)
(Continued)

(52) U.S. Cl.
CPC ......... *H01R 13/6461* (2013.01); *H01R 12/75* (2013.01); *H01R 13/6594* (2013.01);
(Continued)

(58) Field of Classification Search
CPC ................ H01R 13/6461; H01R 12/75; H01R 13/6594; H01R 12/716; H01R 12/718;
(Continued)

(56) References Cited

U.S. PATENT DOCUMENTS 10,103,501 B2    10/2018  Lin et al.
10,741,944 B2    8/2020   Long
(Continued)

FOREIGN PATENT DOCUMENTS

CN    201178206 Y    1/2009
CN    204966748 U    1/2016
(Continued)

*Primary Examiner* — Abdullah A Riyami
*Assistant Examiner* — Justin M Kratt

(57) ABSTRACT

An electrical connector connected with a cable connector. The cable connector comprises a plurality of ground terminals, a plurality of signal terminals, and an electromagnetic shielding member. The electrical connector comprises a circuit board, a plurality of ground conductive pads, a plurality of signal conductive pads, and a shielding ground conductive pad. The circuit board comprises an electrical connecting area. The plurality of ground conductive pads are disposed on a surface of the electrical connecting area of the circuit board at intervals. The plurality of signal conductive pads are disposed on the surface of the electrical connecting area of the circuit board at intervals. At least one signal conductive pad is disposed between two adjacent ground conductive pads. The shielding ground conductive pad is disposed on the surface of the electrical connecting area of the circuit board and is disposed on one side of the plurality of ground conductive pads.

17 Claims, 22 Drawing Sheets

(51) Int. Cl.
*H01R 13/6594* (2011.01)
*H01R 13/6471* (2011.01)
*H01R 13/6591* (2011.01)
*H01R 12/71* (2011.01)
*H01R 13/6463* (2011.01)
*H05K 1/02* (2006.01)
*H01R 13/6585* (2011.01)
*H01R 13/648* (2006.01)
*H01R 13/502* (2006.01)

(52) U.S. Cl.
CPC .......... *H01R 12/714* (2013.01); *H01R 12/716* (2013.01); *H01R 12/718* (2013.01); *H01R 13/502* (2013.01); *H01R 13/648* (2013.01); *H01R 13/6463* (2013.01); *H01R 13/6471* (2013.01); *H01R 13/6585* (2013.01); *H01R 13/6591* (2013.01); *H01R 13/65914* (2020.08); *H05K 1/0219* (2013.01)

(58) Field of Classification Search
CPC ............ H01R 13/6471; H01R 13/6591; H01R 13/502; H01R 12/714; H01R 13/6463; H01R 13/6585; H01R 13/65914; H01R 13/648; H05K 1/0219
See application file for complete search history.

(56) References Cited

U.S. PATENT DOCUMENTS

| | | | |
|---|---|---|---|
| 10,749,289 B2 | 8/2020 | Long | |
| 10,756,489 B2 | 8/2020 | Hu et al. | |
| 10,958,016 B2 * | 3/2021 | Yang | H01R 13/582 |
| 2017/0018880 A1 | 1/2017 | Phillips et al. | |
| 2020/0067235 A1 | 2/2020 | Long | |
| 2020/0076131 A1 | 3/2020 | Hu et al. | |
| 2020/0076132 A1 | 3/2020 | Yang et al. | |
| 2020/0194914 A1 | 6/2020 | Hsiao et al. | |
| 2020/0212632 A1 | 7/2020 | Liong et al. | |

FOREIGN PATENT DOCUMENTS

| | | | |
|---|---|---|---|
| CN | 108448287 A | 8/2018 | |
| CN | 109193193 A | 1/2019 | |
| CN | 109193206 A | 1/2019 | |
| CN | 109286092 A | 1/2019 | |
| CN | 109411957 A | 3/2019 | |
| CN | 109565122 A | 4/2019 | |
| CN | 208862209 U | 5/2019 | |
| CN | 109891676 A | 6/2019 | |
| CN | 110808490 A | 2/2020 | |
| CN | 110867684 A | 3/2020 | |
| CN | 210576571 U | 5/2020 | |
| CN | 111244697 A | 6/2020 | |
| CN | 111478086 A | 7/2020 | |
| CN | 111525347 A | 8/2020 | |
| EP | 0907221 A2 | 4/1999 | |
| JP | 2019197685 A | 11/2019 | |
| TW | M539731 U | 4/2017 | |
| TW | M552685 U | 12/2017 | |
| TW | 201820710 A | 6/2018 | |
| TW | M599045 U | 7/2020 | |
| WO | 2007/062144 A1 | 5/2007 | |
| WO | WO-2010011753 A1 * | 1/2010 | ......... H01R 13/6471 |

* cited by examiner

ELECTRICAL CONNECTOR WITH GROUND TERMINALS AND SHIELDING GROUND TERMINALS AROUND SIGNAL TERMINALS

CROSS-REFERENCE TO RELATED APPLICATION

This application claims the priority benefit of Chinese Patent Application Serial Number 202011072601.5, filed on Oct. 9, 2020, the full disclosure of which is incorporated herein by reference.

BACKGROUND

Technical Field

The present disclosure relates to the technical field of connector, particularly to an electrical connector connected with a cable connector.

Related Art

As the transmission rate of connectors increases, the requirements for the crosstalk index of the connector becomes more strict, and reducing the crosstalk in connectors also becomes a crucial issue. Conventional cable connectors often comprise a terminal assembly, which comprises a plurality of terminals disposed at intervals and an insulating body. The plurality of terminals often comprises a plurality of ground terminals and a plurality of signal terminals. Two signals are disposed between two ground terminals and form a differential signal pair. However, the two ground terminals can only shield a part of the signal terminals, so the plurality of signal terminals would still mutually crosstalk. An electromagnetic shielding member is additionally disposed inside the conventional cable connectors to deal with the crosstalk issue within the cable connector, but the crosstalk between the cable connector and the mating connector cannot be reduced.

SUMMARY

The embodiments of the present disclosure provide an electrical connector tended to solve the problem that conventional connectors are prone to signal crosstalk during signal transmission.

In one embodiment, an electrical connector is provided, which is connected with a cable connector. The cable connector comprises a plurality of ground terminals, a plurality of signal terminals, and an electromagnetic shielding member. The electrical connector comprises a circuit board, a plurality of ground conductive pads, a plurality of signal conductive pads, and a shielding ground conductive pad. The circuit board comprises an electrical connecting area. The plurality of ground conductive pads are disposed on a surface of the electrical connecting area of the circuit board at intervals. Each of the ground conductive pads is connected with the corresponding ground terminal. The plurality of signal conductive pads are disposed on the surface of the electrical connecting area of the circuit board at intervals. At least one signal conductive pad is disposed between two adjacent ground conductive pads. Each of the signal conductive pads is connected with the corresponding signal terminal. The shielding ground conductive pad is disposed on the surface of the electrical connecting area of the circuit board and is disposed on one side of the plurality of ground conductive pads. The shielding ground conductive pad is connected with the electromagnetic shielding member.

In the embodiments of the present disclosure, by disposing the ground conductive pad on the circuit board, the electromagnetic shielding member of the cable connector would be connected to the shielding ground conductive pad of the circuit board when the electrical connector is connected with the cable connector. Thus, the crosstalk among the plurality of signal terminals transmitting signals between the electrical connector and the mating connector can be avoided to effectively improve the signal transmission performance of electrical connectors.

It should be understood, however, that this summary may not contain all aspects and embodiments of the present disclosure, that this summary is not meant to be limiting or restrictive in any manner, and that the disclosure as disclosed herein will be understood by one of ordinary skill in the art to encompass obvious improvements and modifications thereto.

BRIEF DESCRIPTION OF THE DRAWINGS

The features of the exemplary embodiments believed to be novel and the elements and/or the steps characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION OF THE EMBODIMENTS

The present disclosure will now be described more fully hereinafter with reference to the accompanying drawings, in which exemplary embodiments of the disclosure are shown. This present disclosure may, however, be embodied in many different forms and should not be construed as limited to the embodiments set forth herein. Rather, these embodiments are provided so that this present disclosure will be thorough and complete, and will fully convey the scope of the present disclosure to those skilled in the art.

Certain terms are used throughout the description and following claims to refer to particular components. As one skilled in the art will appreciate, manufacturers may refer to a component by different names. This document does not intend to distinguish between components that differ in name but function. In the following description and in the claims, the terms "include/including" and "comprise/comprising" are used in an open-ended fashion, and thus should be interpreted as "including but not limited to". "Substantial/substantially" means, within an acceptable error range, the person skilled in the art may solve the technical problem in a certain error range to achieve the basic technical effect.

The following description is of the best-contemplated mode of carrying out the disclosure. This description is made for the purpose of illustration of the general principles of the disclosure and should not be taken in a limiting sense. The scope of the disclosure is best determined by reference to the appended claims.

Moreover, the terms "include", "contain", and any variation thereof are intended to cover a non-exclusive inclusion. Therefore, a process, method, object, or device that includes a series of elements not only includes these elements, but also includes other elements not specified expressly, or may include inherent elements of the process, method, object, or device. If no more limitations are made, an element limited by "include a/an . . ." does not exclude other same elements existing in the process, the method, the article, or the device which includes the element.

Figure 1:
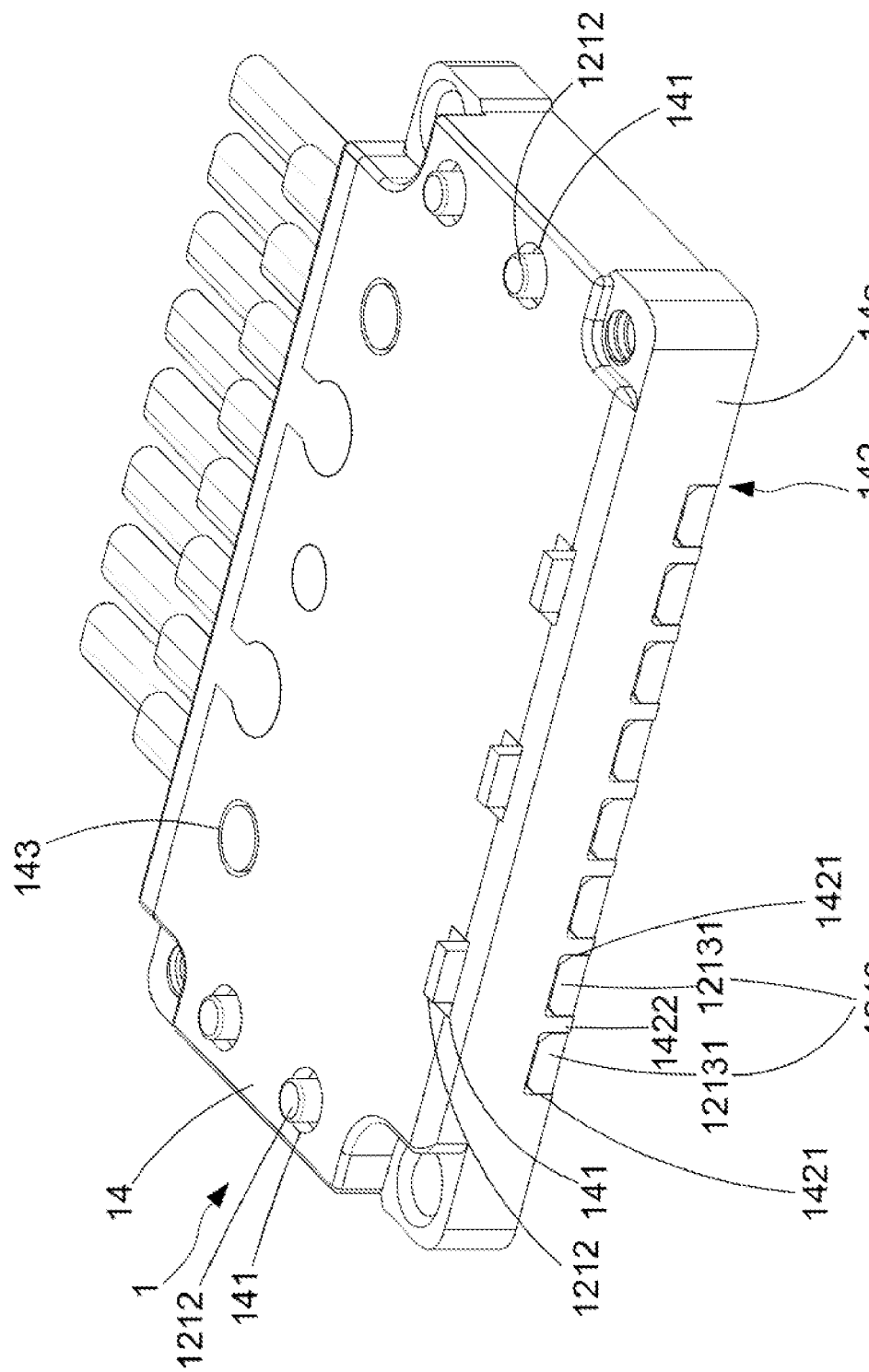
FIG. 1 is a perspective view of an electrical connector of the first embodiment of the present disclosure.
Figure 2:
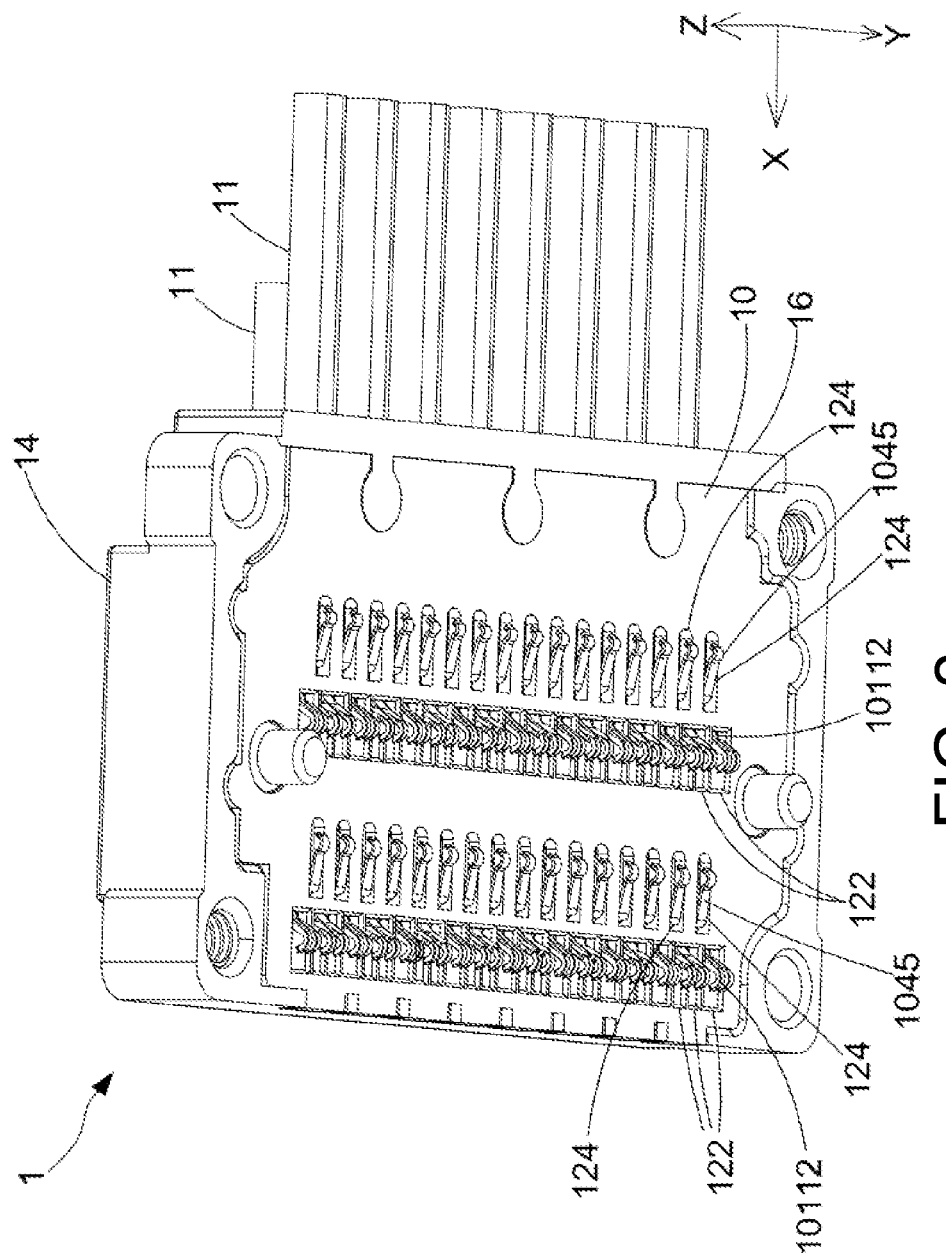
FIG. 2 is another perspective view of the electrical connector of the first embodiment of the present disclosure.
Figure 3:
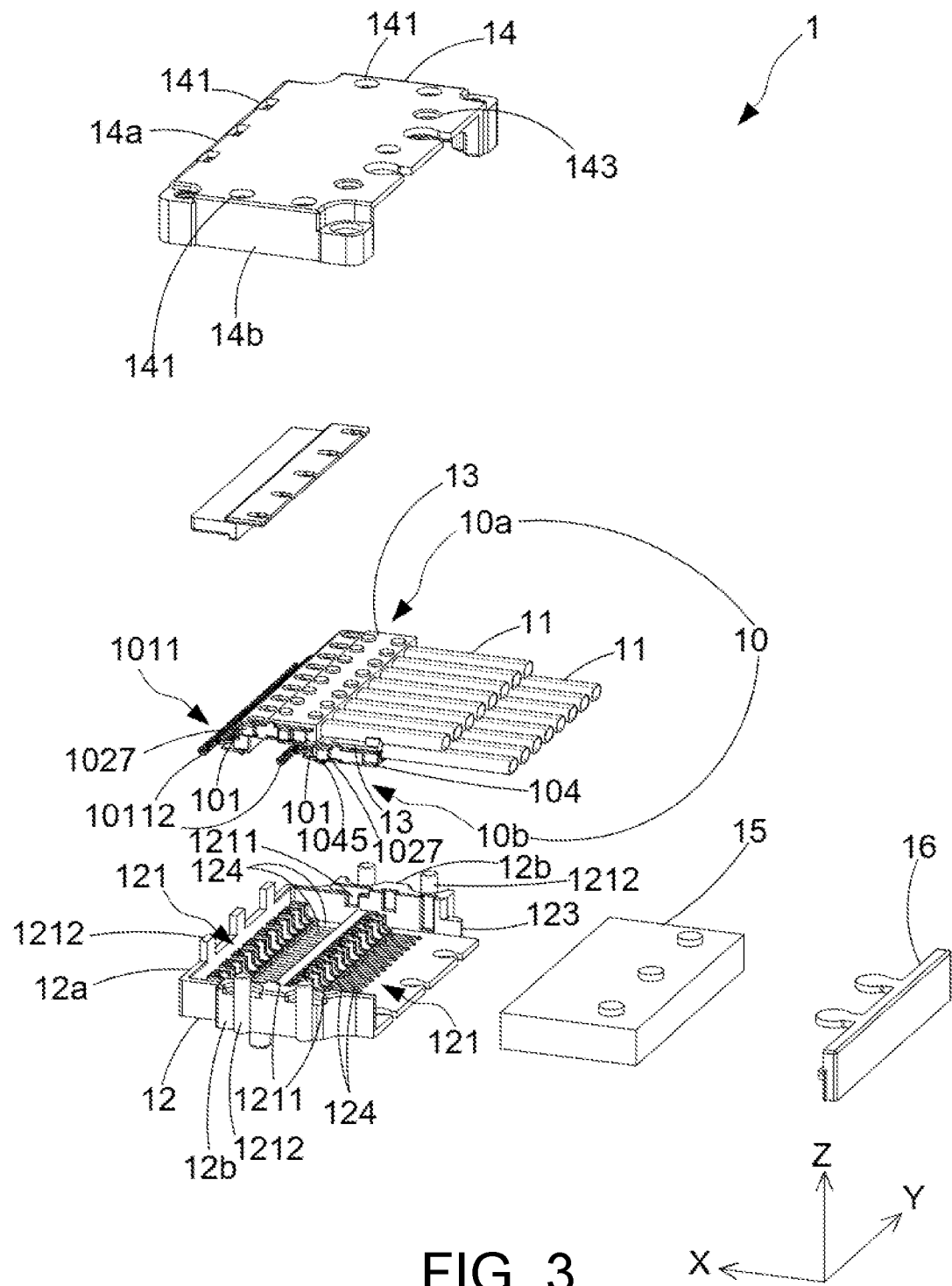
FIG. 3 is an exploded view of the electrical connector of the first embodiment of the present disclosure.

FIG. 1 to FIG. 3 are perspective views and an exploded view of an electrical connector of the first embodiment of the present disclosure. As shown in the figures, in this embodiment, the electrical connector 1 comprises a terminal assembly 10, a plurality of cables 11, and a housing 12. The number of terminal assemblies 10 is two, and each of the terminal assemblies 10 comprises a plurality of terminals 101. The plurality of cables 11 are respectively connected with one end of each of the terminals 101 of each of the terminal assemblies 10. Two terminal assemblies 10 are disposed in the housing 12. Specifically, the housing 12 comprises two accommodating grooves 121. The two accommodating grooves 121 are disposed along a first direction X at intervals and respectively extend along a second direction Y. The two terminal assemblies 10 are respectively disposed in the corresponding accommodating groove 121. The plurality of terminals 101 of each of the terminal assemblies 10 are disposed along the second direction Y at intervals and respectively extend along the first direction X. One end of each of the terminals 101 away from the cable 11 protrudes from the housing 12 through the bottom of the corresponding accommodating groove 121. Specifically, the housing 12 further comprises a plurality of terminal through holes 122, which are respectively disposed on a bottom surface of the corresponding accommodating groove 121. The plurality of terminal through holes 122 in each of the accommodating grooves 121 are disposed on the bottom surface of the accommodating groove 121 along the second direction Y at intervals and penetrate the housing 12 along a third direction Z. In this embodiment, each of the terminal through holes 122 is an elongated hole, that is, the terminal through hole 122 is extending along the first direction X. The plurality of cables 11 extend along the first direction X. One end of each of the terminals 101 away from the cable 11 protrudes from the corresponding terminal through hole 122 through the housing 12. One ends of the plurality of cables 11 away from the plurality of terminals 101 protrude from one side of the housing 12 along the first direction X. Specifically, one side of the housing 12 in the first direction X comprises a wiring opening 123 communicating with an adjacent accommodating groove 121. One ends of the plurality of cables 11 away from the plurality of terminals 101 pass through the wiring opening 123 to protrude from the housing 12. The housing 12 is made of insulative material.

Figure 4:
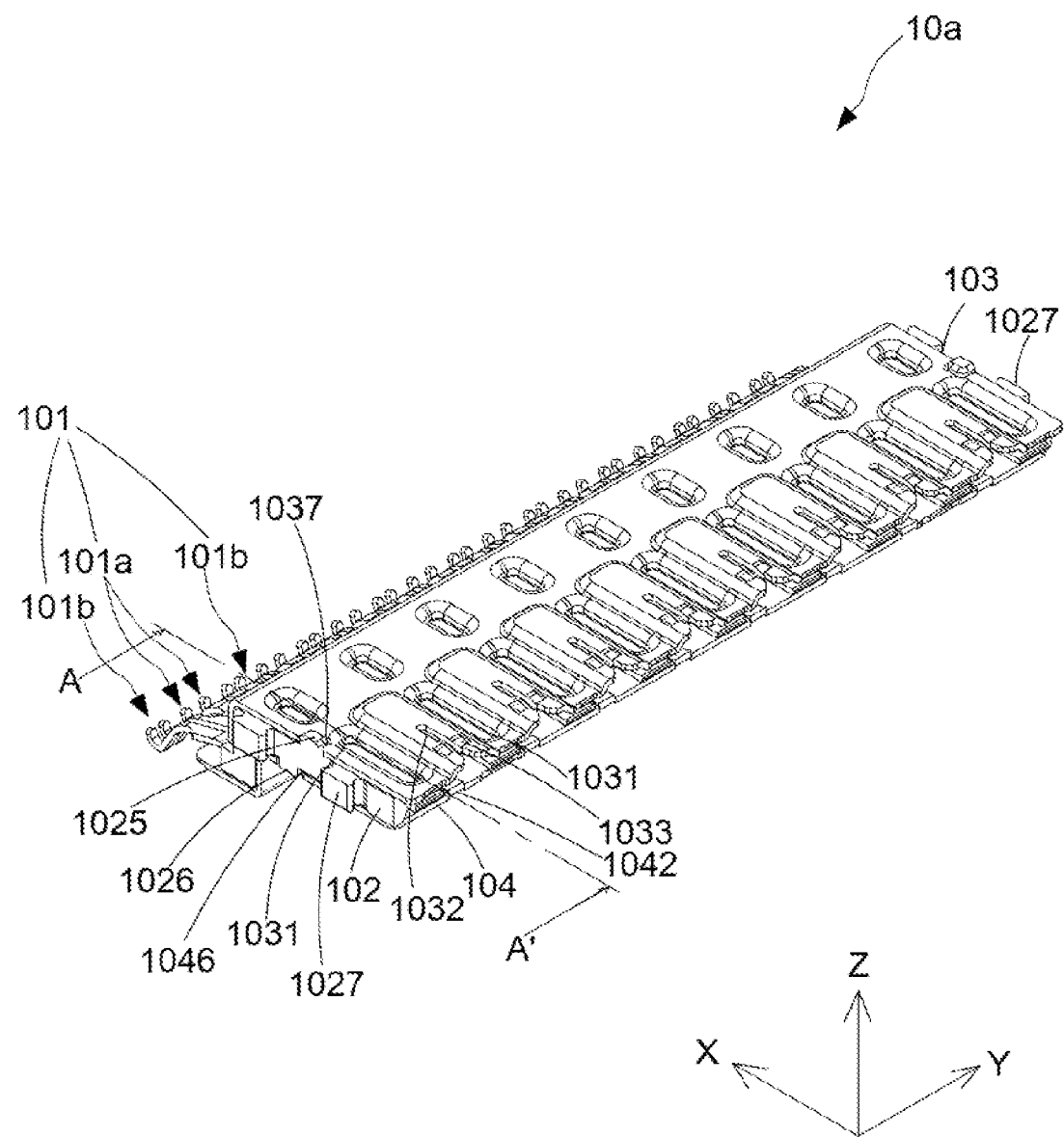
FIG. 4 is a perspective view of a first terminal assembly of the first embodiment of the present disclosure.
Figure 5:
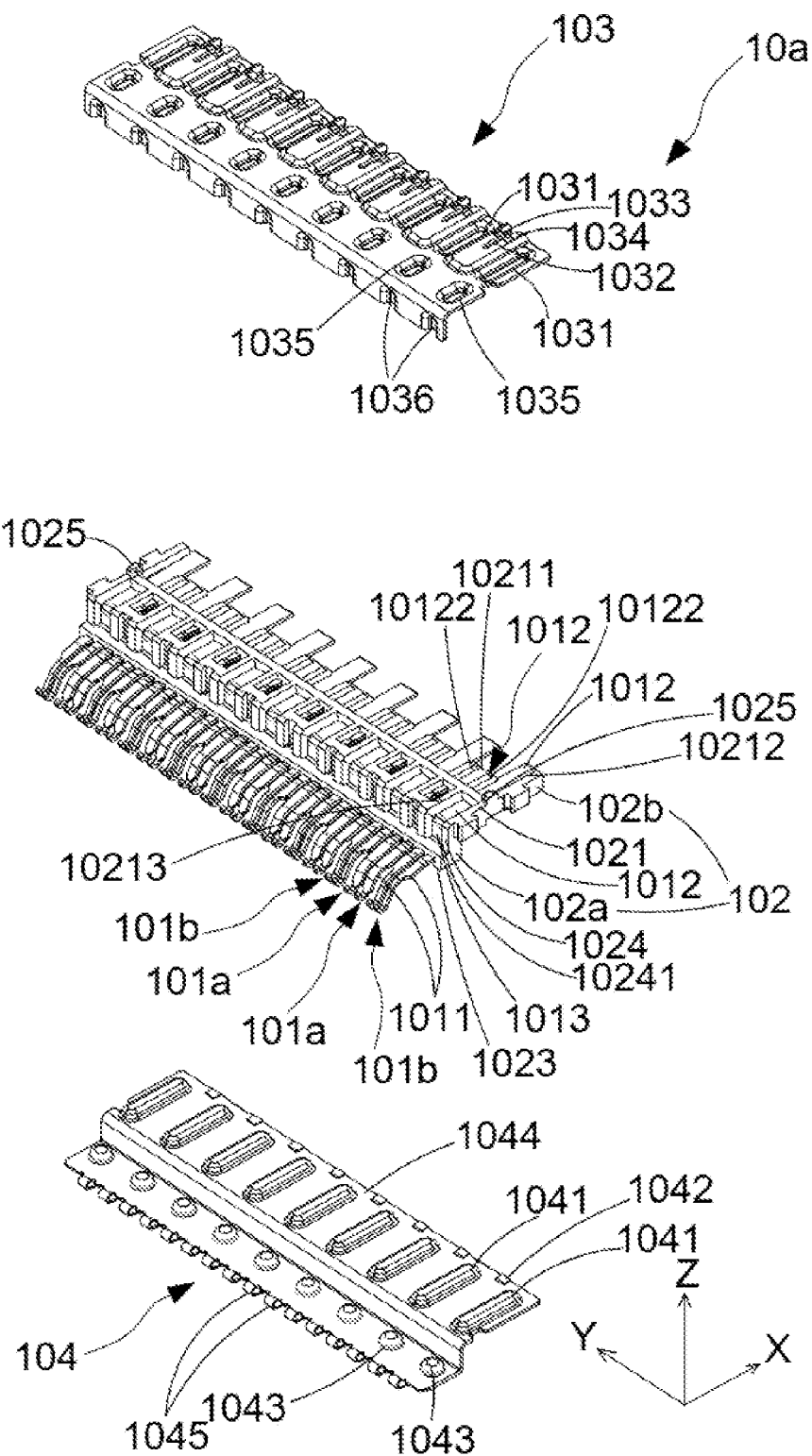
FIG. 5 is an exploded view of a first terminal assembly of the first embodiment of the present disclosure.
Figure 6:
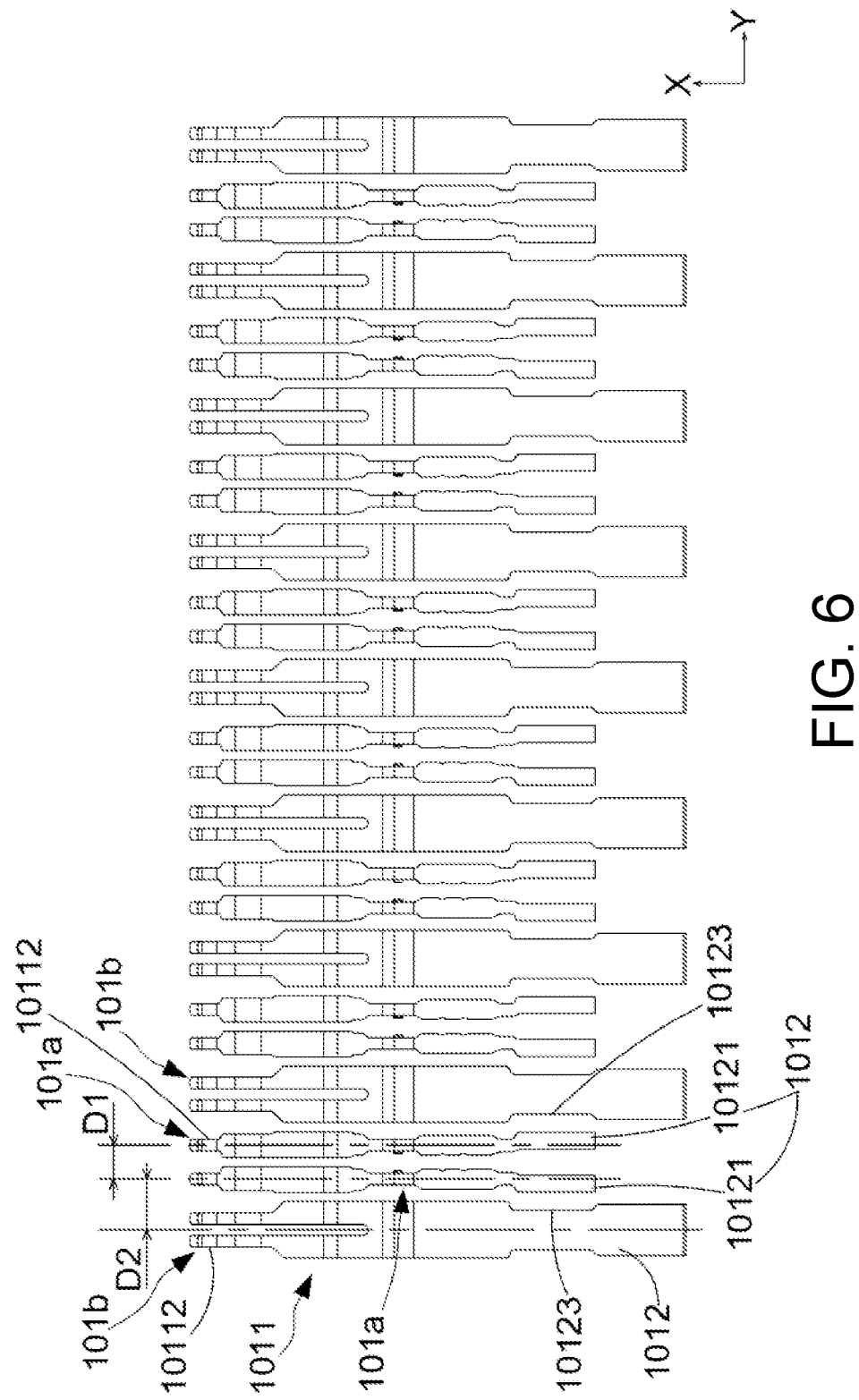
FIG. 6 is a schematic diagram of a plurality of terminals of the first embodiment of the present disclosure.
Figure 7:
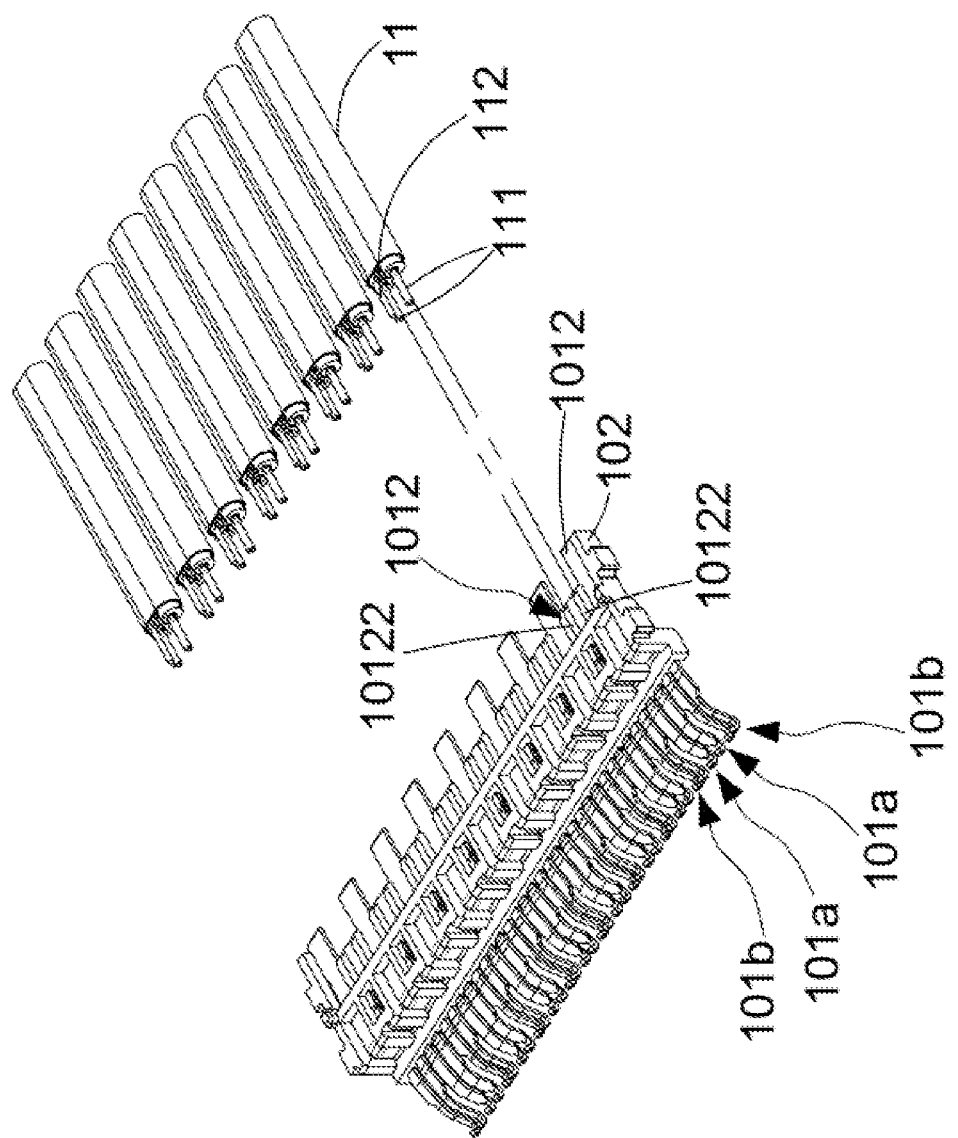
FIG. 7 is a diagram showing the assembly between a cable and the first terminal assembly of the first embodiment of the present disclosure.

The detailed configuration of the terminal assembly 10 disposed in the corresponding accommodating groove 121 is described below. Herein, the terminal assembly 10 of the accommodating groove 121 on the left side of FIG. 3 is defined as the first terminal assembly 10a and the terminal assembly 10 of the accommodating groove 121 on the right side of FIG. 3 is defined as the second terminal assembly 10b for further description. FIG. 4 and FIG. 5 are perspective view and exploded view of a first terminal assembly of the first embodiment of the present disclosure. FIG. 6 is a schematic diagram of a plurality of terminals of the first embodiment of the present disclosure. As shown in the figure, in this embodiment, each of the terminals 10 comprises a contacting end part 1011 and a connecting end part 1012. The first terminal assembly 10a further comprises an insulating body 102, which is disposed at the plurality of terminals 101. The contacting end part 1011 of each of the terminals 101 protrudes from one side of the insulating body 102 in the first direction X. The connecting end part 1012 of each of the terminals 101 is exposed from a surface of the insulating body 102 in the third direction Z for the connection between the cable 11 and the connecting end part 1012 of the corresponding terminal 101. In this embodiment, the plurality of terminals 101 comprises a plurality of signal terminals 101a and a plurality of ground terminals 101b. The plurality of signal terminals 101a are disposed between two adjacent ground terminals 101b and form a group of signal pair. Each of the signal terminals 101a comprises a contacting end part 1011 and a connecting end part 1012, and each of the ground terminals 101b also comprises a contacting end part 1011 and a connecting end part 1012. FIG. 7 is a diagram showing the assembly between a cable and the first terminal assembly of the first embodiment of the present disclosure. As shown in the figure, each of the cables 11 comprises a signal line 111 and a ground line 112. The signal line 111 of each of the cables 11 is connected with the connecting end part 1012 of the corresponding signal terminal 101a, and the ground line 112 of each of the cables 11 is connected with the connecting end part 1012 of the corresponding ground terminal 101b. In this embodiment, the ground line 112 is connected with the connecting end part 1012 of the corresponding ground terminal 101b through an electromagnetic shielding member, which would be further described hereinafter.

Referring to FIG. 6 again, in this embodiment, two signal terminals 101a are disposed between two adjacent ground terminals 101b and form a differential signal pair. A first gap distance D1 exists between a centerline of each of the signal terminals 101a and a centerline of adjacent signal terminals 101a. A second gap distance D2 exists between a centerline of each of the signal terminals 101a and a centerline of adjacent ground terminals 101b. The second gap distance D2 is greater than the first gap distance D1, which indicates that the plurality of terminals 101 are arranged at unequal intervals. In this way, the gap distance between two adjacent differential signal pairs where the plurality of terminals 101 are arranged at unequal intervals is greater than the gap distance between two adjacent differential signal pairs where the plurality of terminals 101 are arranged at equal intervals (having two adjacent differential signal pairs to move in an opposite direction to increase the gap distance in between) to reduce signal crosstalk between two adjacent differential signal pairs. The width of each of the ground terminals 101b in the second direction Y is wider than the width of each of the signal terminals 101a in the second direction Y. Thus, the second gap distance D2 between the centerline of each of the signal terminals 101a and the centerline of the adjacent ground terminal 101b can be increased to increase the distance between the two adjacent differential signal pairs and to further reduce signal crosstalk between the adjacent two differential signal pairs.

Figure 8:
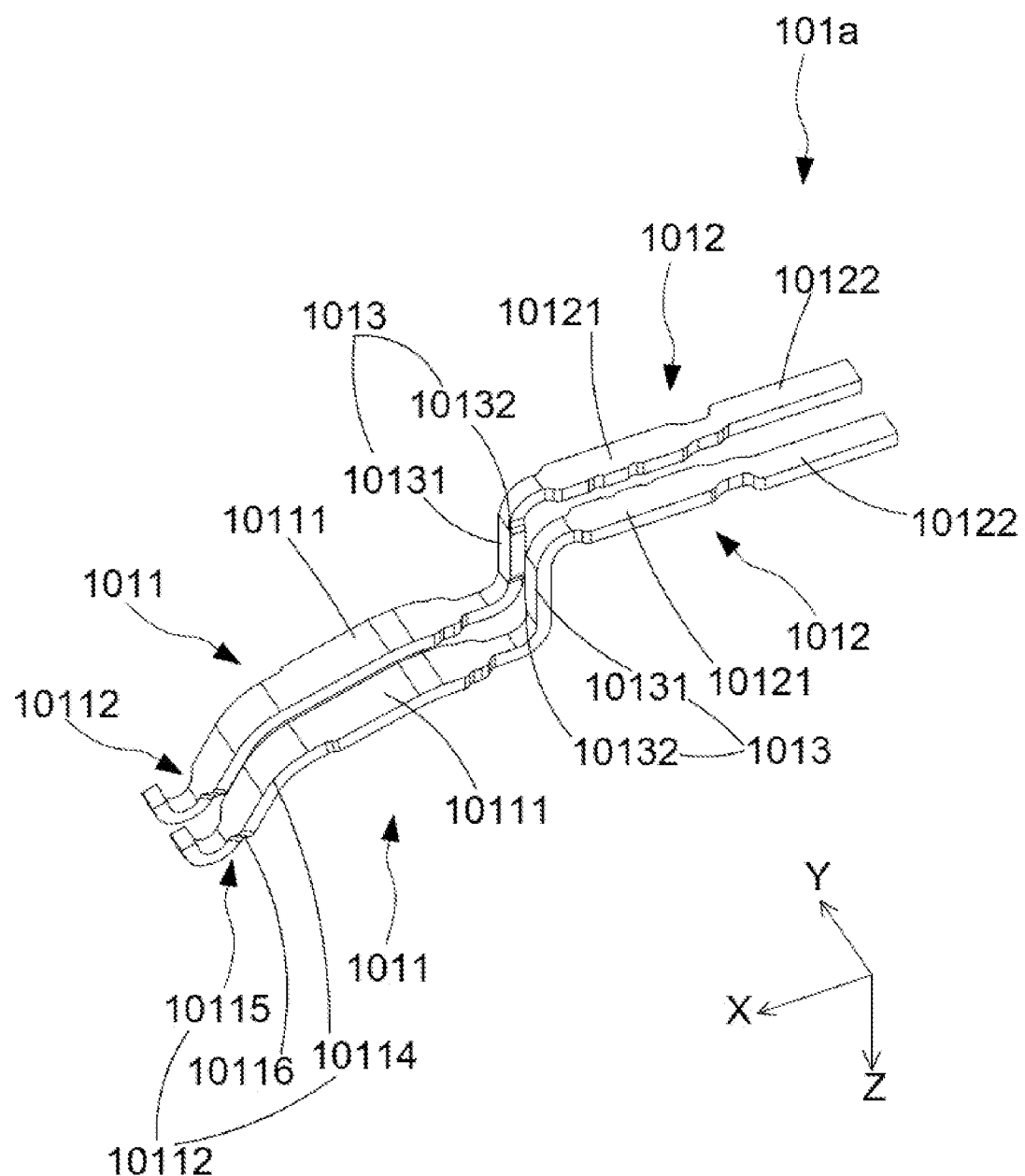
FIG. 8 is a perspective view of a differential signal pair of the first embodiment of the present disclosure.
Figure 9:
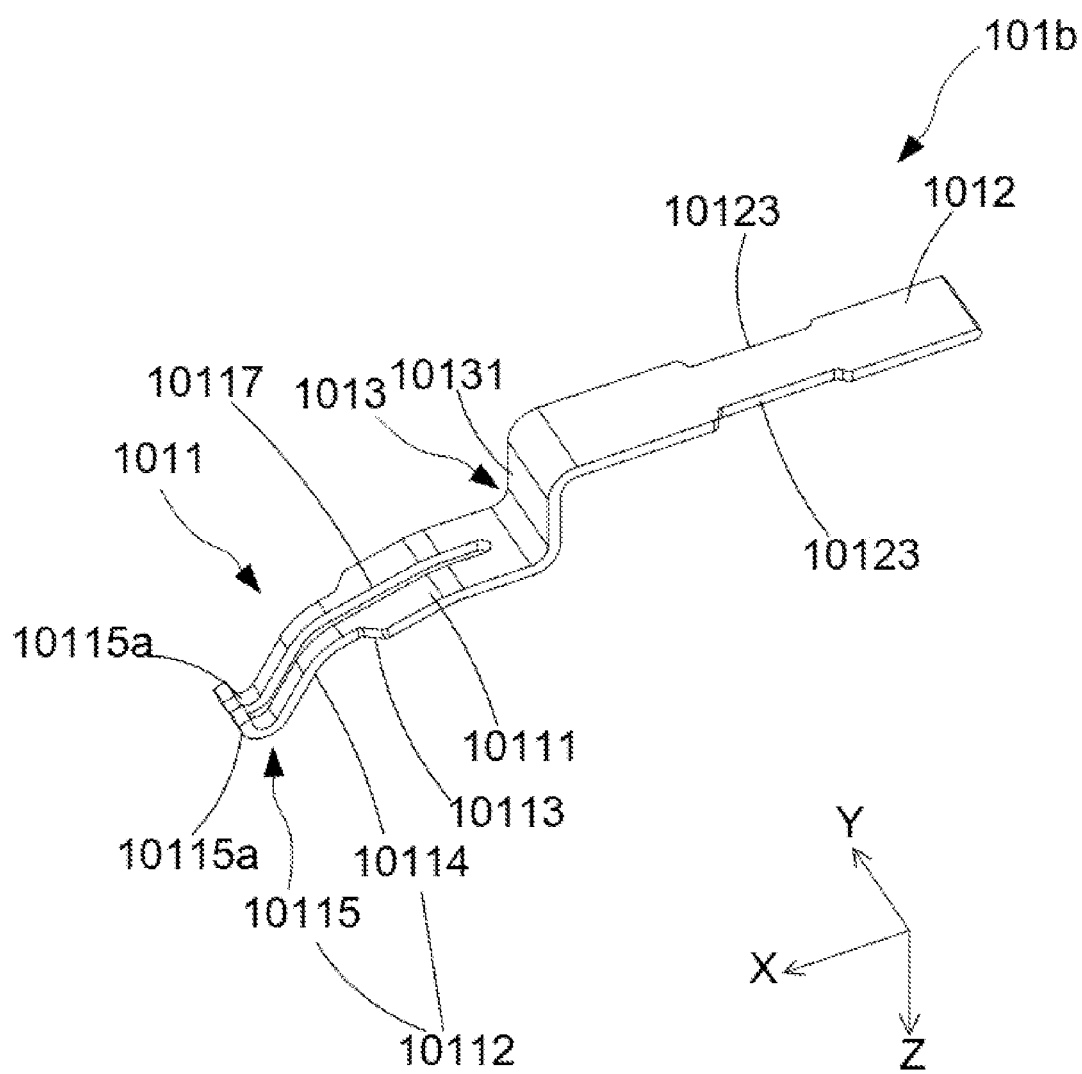
FIG. 9 is a perspective view of a ground terminal of the first embodiment of the present disclosure.

FIG. 8 is a perspective view of a differential signal pair of the first embodiment of the present disclosure. FIG. 9 is a perspective view of a ground terminal of the first embodiment of the present disclosure. In one embodiment, as shown in the figures, each of the terminals 101s (comprising the signal terminal 101a and the ground terminal 101b) further comprises a connecting part 1013. The contacting end part 1011 and the connecting end part 1012 are respectively connected with two opposite ends of the connecting part 1013. The contacting end part 1011 is inclined to the connecting end part 1012. An angle forms between the extending direction of the contacting end part 1011 and the extending direction of the connecting end part 1012. In one embodiment, the length of the connecting end part 1012 of each of the signal terminals 101a extending from the connecting part 1013 in the first direction X (the direction away from the connecting part 1013) is shorter than the length of the connecting end part 1012 of each of the ground terminals 101b extending from the connecting part 1013 in the first direction X (the direction away from the connecting part 1013) (shown in FIG. 6). Thus, the two adjacent ground terminals 101b can protect the two signal terminals 101a disposed between the two adjacent ground terminals 101b, avoiding signal crosstalk between the adjacent two differential signal pairs.

In one embodiment, the two signal terminals 101a between two adjacent ground terminals 101b are symmetrically disposed (shown in FIG. 8). The connecting end part 1012 of each of the signal terminals 101a comprises a connecting main body 10121 and a cable connecting body 10122. The connecting main body 10121 is connected with the connecting part 1013. The cable connecting body 10122 is connected with one end of the connecting main body 10121 away from the connecting part 1013. The width of the cable connecting body 10122 in the second direction Y is greater than or equal to the wire diameter of the signal line 111 of the cable 11, so that the stability of the connection between the cable 11 and the signal terminal 101a can be ensured. The cable connecting body 10122 of each of the signal terminals 101a is closer than the connecting main body 10121 to the adjacent ground terminal 101b. The gap distance between two cable connecting bodies 10122 of two adjacent signal terminals 101a is greater than the gap distance between two connecting main bodies 10121 of the two adjacent signal terminals 101a, so the two signal lines 111 of the cable 11 can be connected with the corresponding cable connecting body 10122. Meanwhile, two opposite sides of the connecting end part 1012 of each of the ground terminals 101b in the second direction Y respectively comprise a first notch 10123. Each of the first notches 10123 corresponds to the cable connecting body 10122 of an adjacent signal terminal 101a (shown in FIG. 6). The first notch 10123 could increase the gap distance between the cable connecting body 10122 of each of the signal terminals 101a and an adjacent ground terminal 101b to keep the signal transmission performance of the electrical connector 1 from being affected.

In one embodiment, the connecting part 1013 of each of the terminals 101 is bent to allow a difference in height between the connecting end part 1012 and the contacting end part 1011 of each of the terminals 101. In this embodiment, the contacting end part 1011 and the connecting end part 1012 of each of the terminals 101 are disposed along the third direction Z at intervals. The connecting part 1013 comprises a connecting body 10131 and is disposed between the contacting end part 1011 and the connecting end part 1012. The extending direction of the connecting body 10131 intersects with the extending direction of the contacting end part 1011 and the extending direction of the connecting end part 1012 respectively. In this embodiment, the connecting body 10131 extends along the third direction Z.

In this embodiment, the width of the connecting part 1013 of each of the signal terminals 101a in the second direction Y is narrower than the width of the contacting end part 1011 and the width of the connecting end part 1012 of the signal terminal 101a in the second direction Y. In this way, the gap distance between the connecting part 1013 of each of the signal terminals 101a and the connecting part 1013 of an adjacent ground terminal 101b can be increased. The connecting part 1013 of each of the signal terminals 101a further comprises a bump 10132. The bump 10132 is disposed on one side of the connecting body 10131 in the second direction Y, and extends toward the connecting body 10131 of the adjacent signal terminal 101a from the connecting body 10131. The bump 10132 of the connecting part 1013 of each of the signal terminals 101a is opposed to the bump 10132 of the connecting part 1013 of the adjacent signal terminal 101a to shorten the gap distance between the connecting part 1013 of each of the signal terminals 101a and the connecting part 1013 of the adjacent signal terminal 101a.

In one embodiment, the contacting end part 1011 of each of the terminals 101 (comprising the signal terminal 101a and the ground terminal 101b) comprises a contacting main body 10111 and a contacting elastic piece 10112. The contacting main body 10111 is connected with one end of the connecting part 1013 away from the connecting end part 1012. The contacting elastic piece 10112 is connected with one end of the contacting main body 10111 away from the connecting part 1013. The width of the contacting main body 10111 of each of the terminals 101 in the second direction Y is wider than the width of the contacting elastic piece 10112 in the second direction Y. In this way, the gap distance between the contacting elastic piece 10112 of each of the terminals 101 and the contacting elastic piece 10112 of the adjacent terminal 101 can be increased. In this embodiment, the distance between the contacting elastic piece 10112 of each of the signal terminals 101a and the contacting elastic piece 10112 of the adjacent ground terminal 101b is greater than the distance between the contacting elastic piece 10112 of each of the signal terminals 101a and the contacting elastic piece 10112 of the adjacent signal terminal 101a.

In this embodiment, a surface of the contacting elastic piece 10112 of each of the signal terminals 101a close to the adjacent signal terminal 101a and a surface of the contacting main body 10111 close to the adjacent signal terminal 101a of each signal terminals 101a are on the same plane, allowing the distance between the contacting main body 10111 of each of the signal terminals 101a and the contacting main body 10111 of the adjacent signal terminal 101a to be equal to the distance between the contacting elastic piece 10112 of each of the signal terminals 101a and the contacting elastic piece 10112 of the adjacent signal terminal 101a to improve the signal transmission performance of the differential signal pairs. In one embodiment, the joint between the contacting main body 10111 and the contacting elastic piece 10112 of each of the terminals 101 comprises a first tapering part 10113, which allows the contacting main body 10111 to be connected with the contacting elastic piece 10112 without obstruction.

In one embodiment, the contacting elastic piece 10112 of each of the terminals 101 comprises an elastic piece main body 10114 and a contacting bump 10115. The elastic piece main body 10114 is connected with the contacting main body 10111. The contacting bump 10115 is connected with one end of the elastic piece main body 10114 away from the contacting main body 10111 and protrudes in a direction away from the contacting main body 10111. The width of the elastic piece main body 10114 of each of the signal terminals 101a in the second direction Y is greater than the width of the contacting bump 10115 of each of the signal terminals 101a in the second direction Y. The width of the elastic piece main body 10114 of each of the ground terminals 101b in the second direction Y is equal to the width of the contacting bump 10115 of each of the ground terminals 101b in the second direction Y. The contacting bump 10115 of each of the signal terminals 101a and the contacting bump 10115 of each of the ground terminals 101b correspond to a plurality of contacting pads of the mating connector to ensure that each of the terminals 101 can be effectively connected with the mating connector. In this embodiment, the joint between the elastic piece main body 10114 and the contacting bump 10115 of each of the signal terminals 101a further comprises a second tapering part 10116, which allows the elastic piece main body 10114 to be connected with the contacting bump 10115 without obstruction.

In this embodiment, the contacting end part 1011 of each of the ground terminals 101b further comprises an opening groove 10117. The opening groove 10117 is provided at the contacting main body 10111 and at the contacting elastic piece 10112 and extends along the first direction X. One end of the opening groove 10117 penetrates one end of the contacting end part 1011 away from the connecting part 1013, dividing the contacting bump 10115 into two sub-contacting bumps 10115a. The width of each of the sub-contacting bumps 10115a in the second direction Y is equal to the width of the contacting bump 10115 of each of the signal terminals 101a, so that the contacting bump 10115 of each of the ground terminals 101b can be quite elastic to connect with the ground conductive pad of the mating connector by direct contacting or by correspondingly arranged then mutually closed to.

Figure 10:
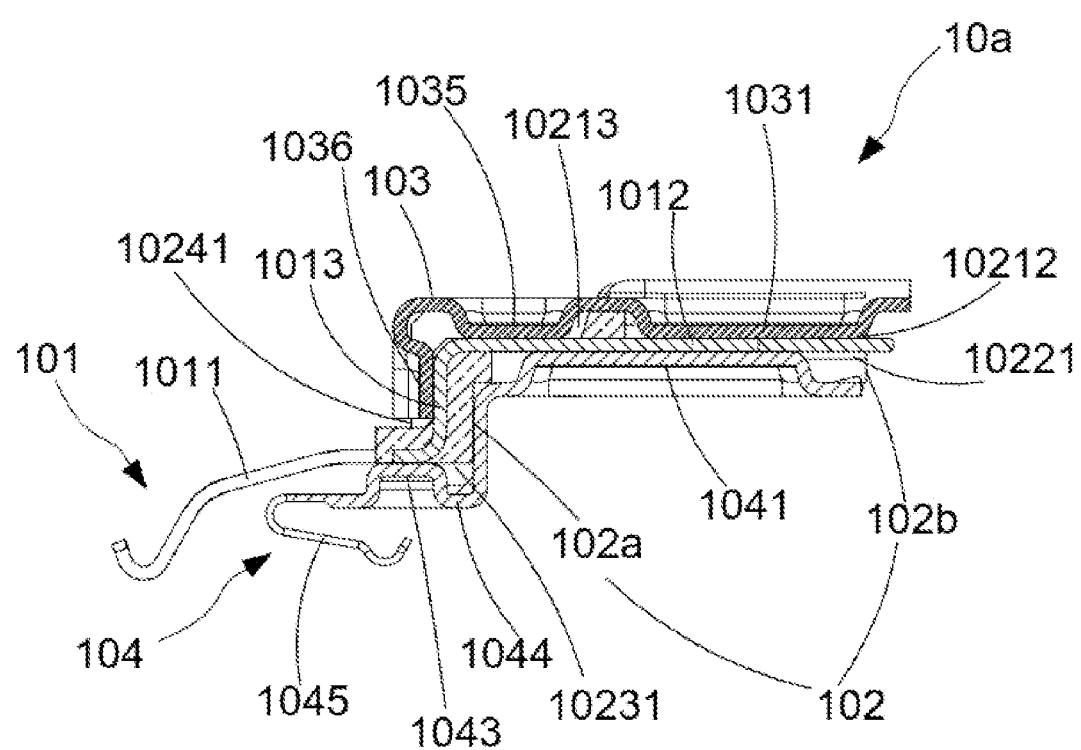
FIG. 10 is a cross-sectional view along line A-A' of FIG. 4.

As the configuration of each of the terminals 101 comprises been described above, the configuration of the insulating body 102 would be illustrated below. Referring to FIG. 5 and FIG. 10, a cross-sectional view along line A-A' of FIG. 4, the insulating body 102 is disposed at the plurality of terminals 101 and covers the connecting end part 1012 and the connecting part 1013 of each of the terminals 101. The contacting end part 1011 of each of the terminals 101 penetrates from one side of the insulating body 102 in the first direction X. The insulating body 102 comprises a first insulator 102a and a second insulator 102b. The second insulator 102b is disposed at one side of the first insulator 102a. The first insulator 102a extends along the third direction Z, and the second insulator 102b extends along the first direction X. The first insulator 102a covers the connecting part 1013 of each of the terminals 101. The contacting end part 1011 of each of the terminals 101 penetrates from one side of the first insulator 102a away from the second insulator 102b.

Figure 11:
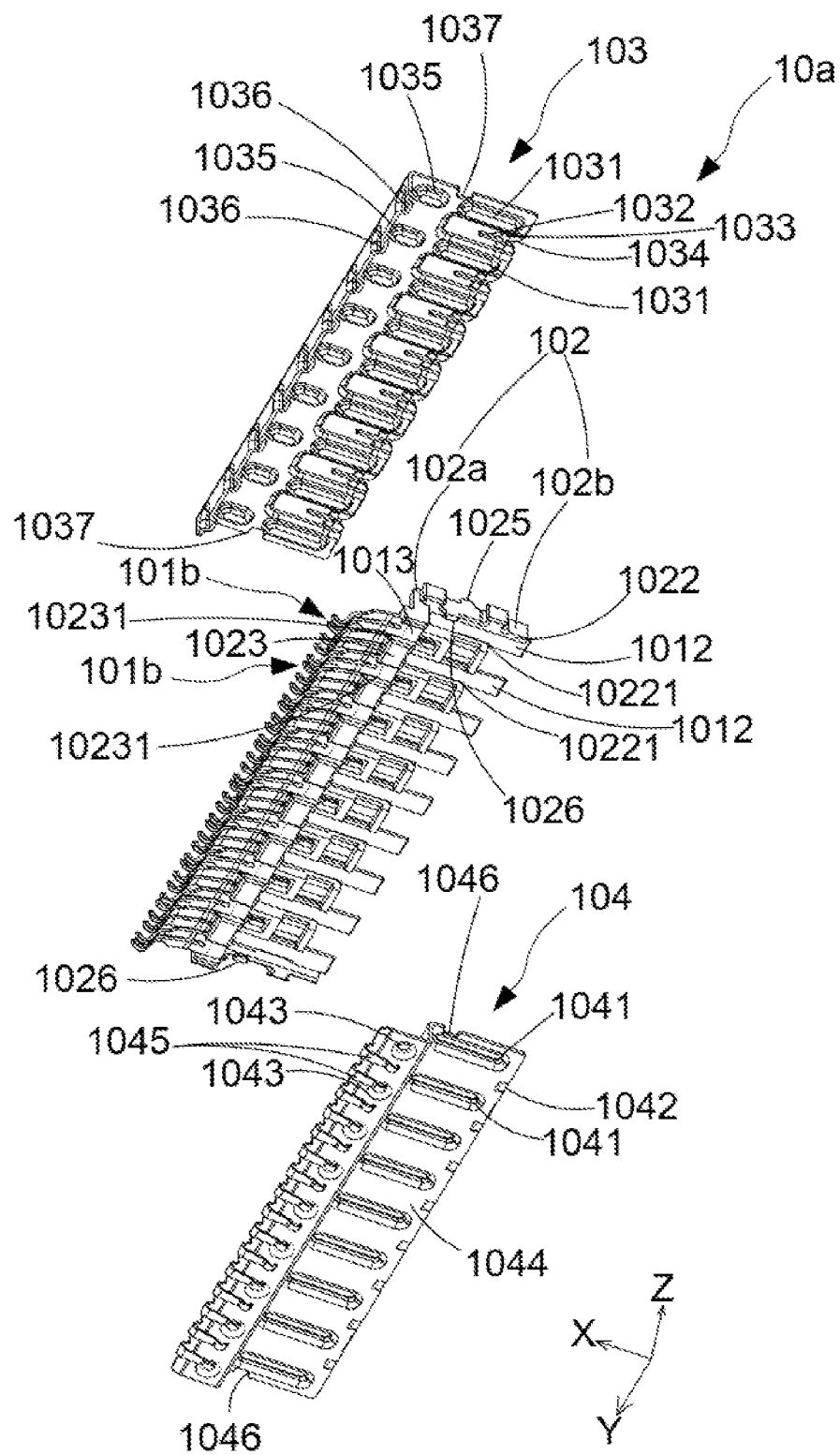
FIG. 11 is another exploded view of the first terminal assembly of the first embodiment of the present disclosure.

FIG. 11 is another exploded view of the first terminal assembly of the first embodiment of the present disclosure. In this embodiment, as shown in the figure, the insulating body 102 comprises a first surface 1021, a second surface 1022, a third surface 1023, and a fourth surface 1024. The first surface 1021 and the second surface 1022 are oppositely disposed in the third direction Z, and the first surface 1021 is disposed on the first insulator 102a and the second insulator 102b, which indicates that an upper surface of the first insulator 102a and an upper surface of the second insulator 102b belong to the first surface 1021. The second surface 1022 is disposed on the second insulator 102b, which indicates that a lower surface of the second insulator 102b belongs to the second surface 1022. The third surface 1023 is in the third direction Z and is disposed at one side of the second surface 1022 away from the first surface 1021. The second surface 1022 is disposed between the first surface 1021 and the third surface 1023, and the third surface 1023 is disposed on the first insulator 102a. That is, the lower surface of the first insulator 102a belongs to the third surface 1023. The fourth surface 1024 is disposed between the first surface 1021 and the third surface 1023 and is a surface of the first insulator 102a away from the second insulator 102b.

In this embodiment, the first surface 1021 of the insulating body 102 comprises a plurality of signal connecting parts 10211 and a plurality of first ground connecting parts 10212. The plurality of signal connecting parts 10211 and the plurality of first ground connecting parts 10212 are alternately arranged in a row along the second direction Y. Two connecting end parts 1012 of two adjacent signal terminals 101a are disposed in the corresponding signal connecting parts 10211. A surface of the cable connecting body 10122 of the connecting end part 1012 of each of the signal terminals 101a in the third direction Z is exposed from the signal connecting part 10211 for the two signal lines 111 of the cable 11 to be connected with the corresponding cable connecting bodies 10122. The connecting end part 1012 of each of the ground terminals 101b is disposed in the corresponding first ground connecting part 10212. The connecting end part 1012 of each of the ground terminals 101b is exposed from the first ground connecting part 10212.

In this embodiment, the second surface 1022 of the insulating body 102 further comprises a plurality of second ground connecting parts 10221. The plurality of second ground connecting parts 10221 are arranged along the second direction Y at intervals, and respectively correspond to the plurality of first ground connecting parts 10212. The connecting end part 1012 of each of the ground terminals 101b is disposed in the corresponding second ground connecting part 10221 and is exposed from the second ground connecting part 10221.

In this embodiment, the first terminal assembly further comprises a first electromagnetic shielding member 103 and a second electromagnetic shielding member 104. The first electromagnetic shielding member 103 and the second electromagnetic shielding member 104 are respectively disposed on the insulating body 102. The first electromagnetic shielding member 103 is connected with a surface of the connecting end part 1012 of the ground terminal 101b exposed from each of the first ground connecting parts 10212. The second electromagnetic shielding member 104 is connected with a surface of the connecting end part 1012 of the ground terminal 101b exposed from each of the second ground connecting parts 10221. The first electromagnetic shielding member 103 can be connected with the surface of the connecting end part 1012 of the ground terminal 101b exposed from each of the first ground connecting parts 10212 by direct contacting or by correspondingly arranged then mutually closed to. Similarly, the second electromagnetic shielding member 104 can be connected with the surface of the connecting end part 1012 of the ground terminal 101b exposed from each of the second ground connecting parts 10221 by direct contacting or by correspondingly arranged then mutually closed to.

Figure 12:
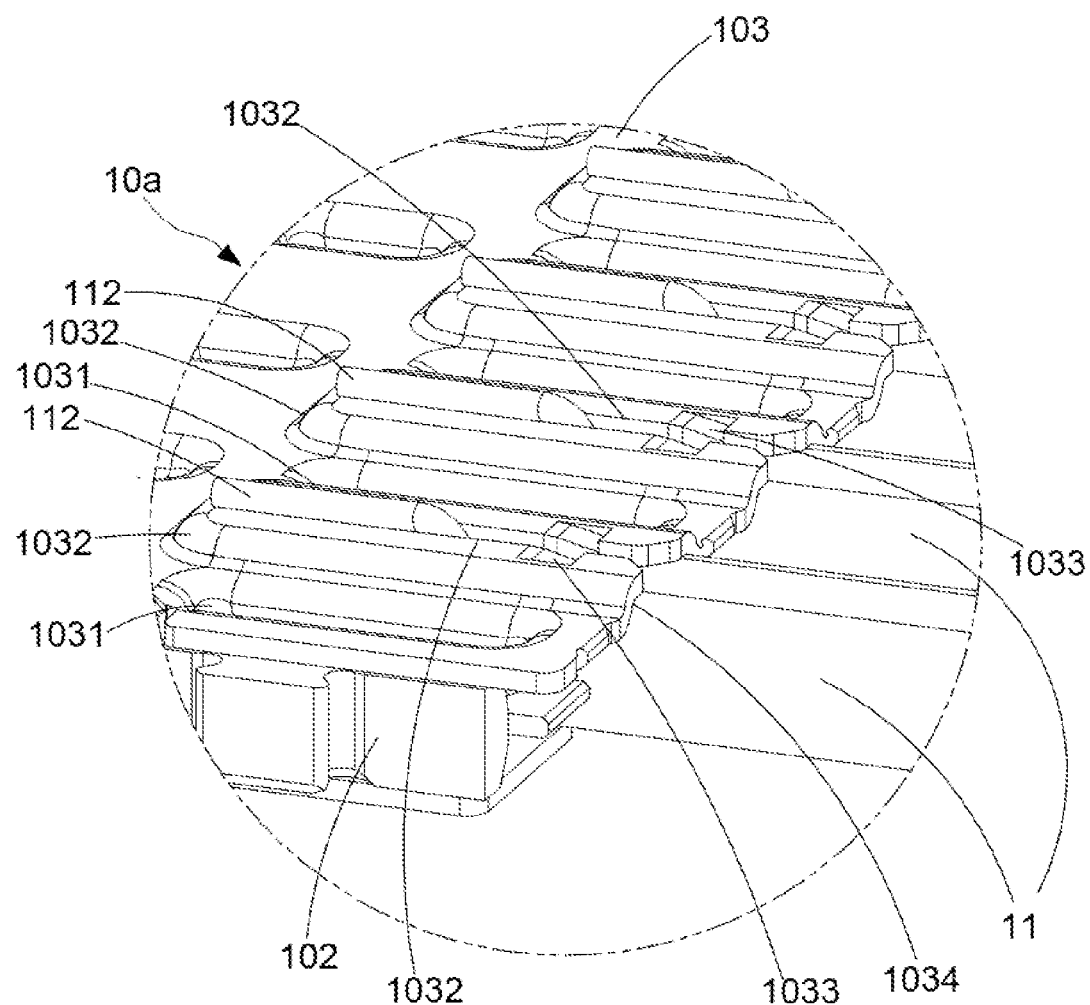
FIG. 12 is a schematic diagram showing the connection between the first terminal assembly and the cable of the first embodiment of the present disclosure.

In this embodiment, the first electromagnetic shielding member 103 is disposed on the first surface 1021 and the fourth surface 1024, and the second electromagnetic shielding member 104 is disposed on the second surface 1022 and the third surface 1023. The first electromagnetic shielding member 103 is disposed above the insulating body 102, and the second electromagnetic shielding member 104 is disposed below the insulating body 102. A surface of the first electromagnetic shielding member 103 corresponding to the first surface 1021 comprises a plurality of first contacting bumps 1031 arranged at intervals. The plurality of first contacting bumps 1031 are respectively connected with the connecting end part 1012 of the ground terminal 101b of the corresponding first ground connecting part 10212. Specifically, the plurality of first contacting bumps 1031 are respectively connected with the connecting end part 1012 of the ground terminal 101b of the corresponding first ground connection part 10212 by direct contacting or by correspondingly arranged then mutually closed to. A surface of the second electromagnetic shielding member 104 corresponding to the second surface 1022 comprises a plurality of second contacting bumps 1041 arranged at intervals. The plurality of second contacting bumps 1041 are respectively connected with the connecting end part 1012 of the ground terminal 101b of the corresponding second ground connecting part 10221. Specifically, the plurality of second contacting bumps 1041 are respectively connected with the connecting end part 1012 of the ground terminal 101b of the corresponding second ground connecting part 10221 by direct contacting or by correspondingly arranged then mutually closed to. FIG. 12 is a schematic diagram showing the connection between the first terminal assembly and the cable of the first embodiment of the present disclosure. As shown in the figure, the ground line 112 of each of the cables 11 is directly connected with the first electromagnetic shielding member 103 to be electrically connected to a plurality of ground terminals 101b. Specifically, the ground line 112 protrudes from the first electromagnetic shielding member 103 and is connected with an outer surface of the first electromagnetic shielding member 103. In this embodiment, a surface of the first electromagnetic shielding member 103 in the third direction Z further comprises a plurality of wiring notches 1032. The plurality of wiring notches 1032 are disposed along the second direction Y at intervals. Each of the wiring notches 1032 is disposed between two adjacent first contacting bumps 1031. The plurality of wiring notches 1032 respectively correspond to the plurality of signal connecting parts 10211. In this way, the ground line 112 of each of the cables 11 could pass through the corresponding wiring notch 1032 to protrude from the first electromagnetic shielding member 103, and the ground line 112 can be connected with the outer surface of the first electromagnetic shielding member 103.

In one embodiment, the surface of the first electromagnetic shielding member 103 in the third direction Z further comprises a plurality of first positioning elastic pieces 1033, each of which is disposed between two adjacent first contacting bumps 1031 and extends toward the insulating body 102. The plurality of first positioning elastic pieces 1033 respectively correspond to the plurality of signal connecting parts 10211. The surface of the second electromagnetic shielding member 104 in the third direction Z further comprises a plurality of second positioning elastic pieces 1042, each of which is disposed between two adjacent second contacting bumps 1041 and extends toward the insulating body 102. The plurality of second positioning elastic pieces 1042 respectively correspond to the plurality of signal connecting parts 10211. When each of the cables 11 is disposed between the first electromagnetic shielding member 103 and the second electromagnetic shielding member 104, the first positioning elastic piece 1033 and the second positioning elastic piece 1042 would abut against the surface of the cable 11 to secure the cable 11 to the first electromagnetic shielding member 103 and to the second electromagnetic shielding member 104, so that the cable 11 would not be easily detached from the first electromagnetic shielding member 103 and nor the second electromagnetic shielding member 104, and would not be detached from the plurality of the terminals 101. In other embodiments, the above-mentioned effects can also be achieved even the plurality of first positioning elastic pieces 1033 or the plurality of second positioning elastic pieces 1042 is omitted, which would not be repeated herein.

In one embodiment, the surface of the first electromagnetic shielding member 103 in the third direction Z further comprises a plurality of cable accommodating bumps 1034, which are arranged along the second direction Y at intervals. Each of the cable accommodating bumps 1034 is disposed between two adjacent first contacting bumps 1031. The protruding direction of the first contacting bump 1031 is opposite to the protruding direction of the cable accommodating bump 1034. In other words, the first contacting bump 1031 protrudes in a direction closing to the insulating body 102, and the cable accommodating bump 1034 protrudes in a direction away from the insulating body 102. In this embodiment, the plurality of wiring notches 1032 and the plurality of first positioning elastic pieces 1033 are respectively disposed on a surface of the corresponding cable accommodating bump 1034 in the third direction Z. That is, each of the cable accommodating bumps 1034 comprises a wiring notch 1032 and a first positioning elastic piece 1033.

The plurality of cable accommodating bumps 1034 respectively correspond to the plurality of signal connecting parts 10211. An accommodating space exists between each of the cable accommodating bumps 1034 and the corresponding signal connecting part 10211. Two signal lines 111 of each of the cables 11 could enter the accommodating space and are respectively connected with two signal terminals 101*a* exposed from the signal connecting part 10211 to keep the first electromagnetic shielding member 103 from contacting with the two signal lines 111 of each of the cables 11.

In this embodiment, the first surface 1021 of the insulating body 102 further comprises a plurality of third ground connecting parts 10213. The plurality of third ground connecting parts 10213 are disposed in a row along the second direction Y at intervals and are disposed on one side of the plurality of first ground connecting parts 10212 close to the plurality of contacting end parts 1011 of the plurality of terminals 101, as shown in FIG. 10, the plurality of third ground connecting parts 10213 are disposed on the left side of the plurality of first ground connecting parts 10212. The plurality of third ground connecting parts 10213 respectively correspond to the plurality of first ground connecting parts 10212, and one side of the connecting end part 1012 of each of the ground terminals 101*b* close to the contacting end part 1011 is exposed from the corresponding third ground connecting part 10213. The surface of the first electromagnetic shielding member 103 corresponding to the first surface 1021 further comprises a plurality of third contacting bumps 1035 which are disposed at intervals. The plurality of third contacting bumps 1035 are disposed on one side of the plurality of first contacting bumps 1031, and are respectively connected with the connecting end part 1012 of the ground terminal 101*b* of the corresponding third ground connecting part 10213. Specifically, the plurality of third contacting bumps 1035 are respectively connected with the connecting end part 1012 of the ground terminal 101*b* of the corresponding third ground connecting part 10213 by direct contacting or by correspondingly arranged then mutually closed to.

In this embodiment, the third surface 1023 of the insulating body 102 further comprises a plurality of fourth ground connecting parts 10231. The plurality of fourth ground connecting parts 10231 are arranged in a row along the second direction Y at intervals and respectively correspond to the plurality of second ground connecting parts 10221. The connecting part 1013 of each of the ground terminals 101*b* is exposed from the corresponding fourth ground connecting part 10231. A surface of the second electromagnetic shielding member 104 corresponding to the third surface 1023 comprises a plurality of fourth contacting bumps 1043 arranged at intervals. The plurality of fourth contacting bumps 1043 are disposed on one side of the plurality of second contacting bumps 1041, and are respectively connected with the connecting part 1013 of the ground terminal 101*b* exposed from the corresponding fourth ground connecting part 10231. Specifically, the plurality of fourth contacting bumps 1043 are respectively connected with the connecting part 1013 of the ground terminal 101*b* exposed from the corresponding fourth ground connecting part 10231 by direct contacting or by correspondingly arranged then mutually closed to.

In this embodiment, the fourth surface 1024 of the insulating body 102 further comprises a plurality of fifth ground connecting parts 10241. The plurality of fifth ground connecting parts 10241 are arranged in a row along the second direction Y at intervals and respectively correspond to the plurality of third ground connecting parts 10213. The connecting body 10131 of the connecting part 1013 of each of the ground terminals 101*b* is exposed from the corresponding fifth ground connecting part 10241. A surface of the first electromagnetic shielding member 103 corresponding to the fourth surface 1024 further comprises a plurality of fifth contacting bumps 1036 arranged at intervals. The plurality of fifth contacting bumps 1036 are disposed on one side of the plurality of third contacting bumps 1035 and are respectively connected with the connecting part 1013 of the ground terminal 101*b* exposed from the corresponding fifth ground connecting part 10241. Specifically, the plurality of fifth contact bumps 1036 are respectively connected with the connecting part 1013 of the ground terminal 101*b* exposed from the corresponding fifth ground connecting part 10241 by direct contacting or by correspondingly arranged then mutually closed to. In this embodiment, each of the fifth ground connecting parts 10241 is respectively communicating with the corresponding third ground connecting part 10213.

Thus, by providing the third ground connecting part 10213, the fourth ground connecting part 10231, and the fifth ground connecting part 10241, the exposed area of the ground terminal 101*b* from the insulating body 102 can be increased, and by providing the third contacting bump 1035 and the fifth contacting bump 1036 on the first electromagnetic shielding member 103 and providing the fourth contacting bump 1043 on the second electromagnetic shielding member 104, the area where the first electromagnetic shielding member 103 and the second electromagnetic shielding member 104 are connected with the ground terminal 101*b* can be increased. In this way, the electromagnetic shielding performance of the first electromagnetic shielding member 103 and the second electromagnetic shielding member 104 can be improved, allowing the first electromagnetic shielding member 103 and the second electromagnetic shielding member 104 to keep the two signal terminals 101*a* of each of the differential signal pairs from being electromagnetically interfered from external and to avoid mutual interference between adjacent two differential signal pairs.

In one embodiment, the second electromagnetic shielding member 104 further comprises a shielding body 1044 and a plurality of ground elastic pieces 1045. The plurality of second contacting bumps 1041 and the plurality of fourth contacting bumps 1043 are disposed on the shielding body 1044. The plurality of ground elastic pieces 1045 are disposed along the second direction Y at intervals at one end of the shielding body 1044 in the first direction X and are disposed at one side of the shielding body 1044 in the third direction Z. The plurality of ground elastic pieces 1045 extend in a direction close to the connecting end part 1012 of each of the terminals 101. In this embodiment, the plurality of ground elastic pieces 1045 are disposed under the shielding body 1044. One end of each of the ground elastic pieces 1045 is connected with one end of the shielding body 1044 in the first direction X. Each of the ground elastic pieces 1045 is inclined to the shielding body 1044. An angle is formed between each of the ground elastic pieces 1045 and the shielding body 1044, and the angle is smaller than 90 degrees. In this embodiment, two ground elastic pieces 1045 are provided between two adjacent fourth contacting bumps 1043. Each of the ground elastic pieces 1045 corresponds to a gap between the adjacent signal terminal 101*a* and the ground terminal 101*b*. In this embodiment, the plurality of ground elastic pieces 1045 of the second electromagnetic shielding member 104 are connected with a shielding ground conductive pad of the mating connector.

In one embodiment, two opposite sides of the insulating body 102 in the second direction Y are respectively provided with a first buckling part 1025 and a second buckling part 1026. Two opposite sides of the first electromagnetic shielding member 103 in the second direction Y are respectively provided with a third buckling part 1037. The third buckling part 1037 engages with the corresponding first buckling part 1025 to position the first electromagnetic shielding member 103 on the insulating body 102. Two opposite sides of the second electromagnetic shielding member 104 in the second direction Y are respectively provided with a fourth buckling part 1046. Each of the fourth buckling parts 1046 is buckled with the corresponding second buckling part 1026 to position the second electromagnetic shielding member 104 on the insulating body 102. Specifically, each of the first buckling parts 1025 and each of the second buckling parts 1026 are respectively a bump. Each of the first buckling parts 1025 and each of the second buckling parts 1026 extend along the third direction Z. Each of the third buckling parts 1037 and each of the fourth buckling parts 1046 are respectively a recess. In this embodiment, the first electromagnetic shielding member 103 and the second electromagnetic shielding member 104 are made of conductive materials, such as conductive plastic, metal, or electroplated plastic.

Figure 13:
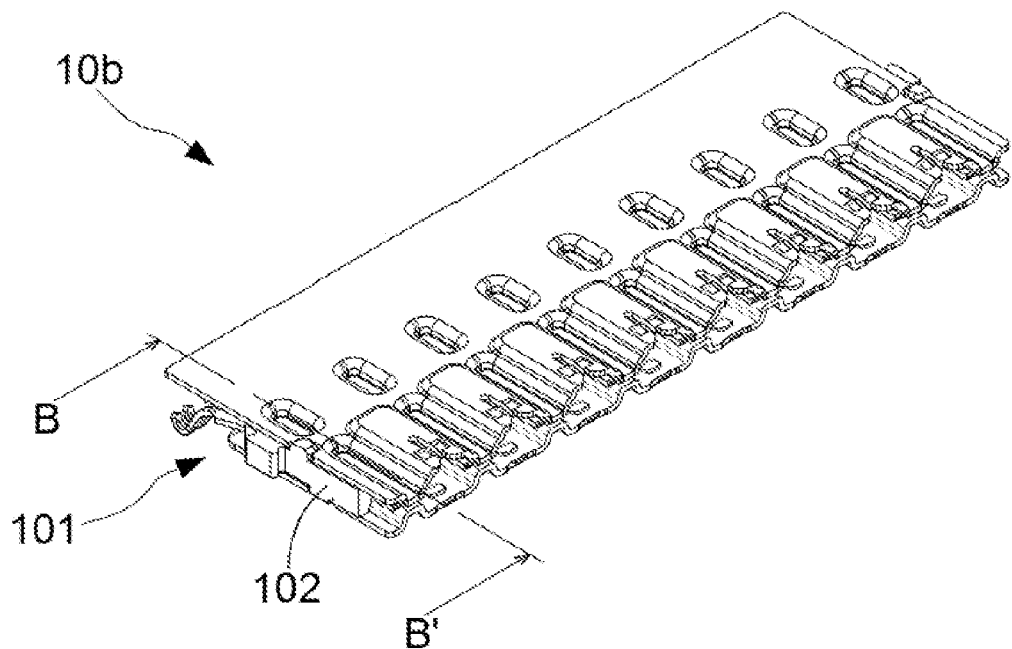
FIG. 13 is a perspective view of a second terminal assembly of the first embodiment of the present disclosure.
Figure 14:
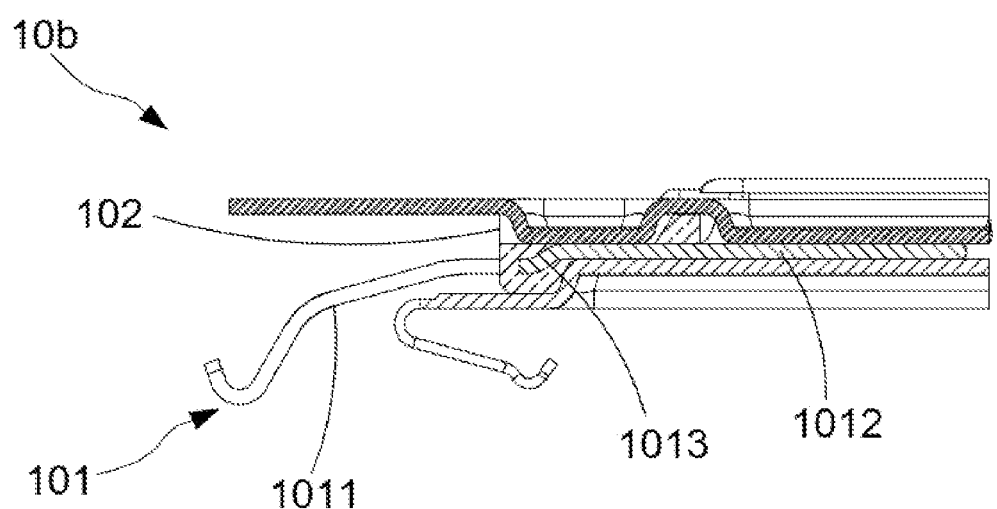
FIG. 14 is a cross-sectional view along line B-B' of FIG. 13.

FIG. 13 is a perspective view of a second terminal assembly of the first embodiment of the present disclosure. FIG. 14 is a cross-sectional view along line B-B' of FIG. 13. As shown in the figures, the second terminal assembly 10b of this embodiment is different from the first terminal assembly 10a in that the height difference between the connecting end part 1012 of each of the terminals 101 of the second terminal assembly 10b and the contacting end part 1011 is smaller than the height difference between the connecting end part 1012 of each of the terminals 101 of the first terminal assembly 10a and the contacting end part 1011. Thus, the first insulator 102a of the insulating body 102 of the first terminal assembly 10a is omitted in the insulating body 102 of second terminal assembly 10b, which also indicates that the insulating body 102 is flat-shaped and the insulating body 102 directly covers the connecting end part 1012 and the connecting part 1013 of each of the terminals 101. In this embodiment, the plurality of fifth ground connecting parts 10241 of the insulating body 102 of the first terminal assembly 10a are also omitted in the insulating body 102 of second terminal assembly 10b, and the fifth contacting bumps 1036 of the first electromagnetic shielding member 103 of the first terminal assembly 10a are also omitted in the first electromagnetic shielding member 103 of the second terminal assembly 10b. Except for the above differences, the rest of the configurations of the second terminal assembly 10b are substantially the same as those of the first terminal assembly 10a. The method to assemble the cable 11 to the second terminal assembly 10b is the same as the method to assemble the cable 11 to the first terminal assembly 10a, which would not be repeated herein.

Referring to FIG. 3 again, the electrical connector 1 further comprises two insulative protection members 13 respectively disposed at the joint between each of the terminal assemblies 10 and the plurality of cables 11, so that the plurality of cables 11 can be stably connected with the corresponding terminal assembly 10 to keep external aqueous vapor or pollutants from corroding the joint between the plurality of cables 11 and the terminal assembly 10. When each of the terminal assemblies 10 is connected with the plurality of cables 11, the insulative protection member 13 can be formed at the joint between the terminal assembly 10 and the plurality of cables 11 by injection molding.

Referring to FIG. 2 again, the first terminal assembly 10a and the second terminal assembly 10b respectively provided with the plurality of cables 11 and the insulative protection member 13 are then respectively disposed in the corresponding accommodating groove 121. When the first terminal assembly 10a and the second terminal assembly 10b are respectively disposed in the corresponding accommodating groove 121, the contacting elastic piece 10112 of the contacting end part 1011 of each of the terminals 101 of each of the terminal assemblies 10 would protrude from the housing 12 through the corresponding terminal through hole 122, and the plurality of ground elastic pieces 1045 of the second electromagnetic shielding member 104 of each of the terminal assemblies 10 would protrude from the housing 12. Specifically, the housing 12 of this embodiment further comprises a plurality of ground through holes 124 respectively provided on a bottom surface of the corresponding accommodating groove 121. The plurality of ground through holes 124 in each of the accommodating grooves 121 are disposed on the bottom surface of the accommodating groove 121 at intervals along the second direction Y, and penetrate the housing 12 along the third direction Z. In this embodiment, each of the ground through holes 124 is elongated, that is, the ground through hole 124 extends along the first direction X. When the terminal assembly 10 is disposed in the corresponding accommodating groove 121, the plurality of ground elastic pieces 1045 would respectively protrude from the housing 12 through the corresponding ground through hole 124.

In this embodiment, when the first terminal assembly 10a and the second terminal assembly 10b are respectively disposed in the corresponding accommodating groove 121, the first terminal assembly 10a would be disposed above the second terminal assembly 10b, the plurality of cables 11 connected with the first terminal assembly 10a would pass through the upper area of the second terminal assembly 10b, and the plurality of cables 11 connected with the first terminal assembly 10a and the plurality of cables 11 connected with the second terminal assembly 10b would pass through the wiring opening 123 of the housing 12. The second electromagnetic shielding member 104 of the first terminal assembly 10a is connected with the first electromagnetic shielding member 103 of the second terminal assembly 10b to connect the plurality of ground terminals 101b of the first terminal assembly 10a and the plurality of ground terminals 101b of the second terminal assembly 10b in series. In this way, the crosstalk between the two terminal assemblies 10 of the electrical connector 1 during signal transmission can be avoided to improve signal transmission performance of the electrical connector 1. The second electromagnetic shielding member 104 of the first terminal assembly 10a and the first electromagnetic shielding member 103 of the second terminal assembly 10b can also be connected through a conductor to perform the above-mentioned effect. In other embodiments, the second electromagnetic shielding member 104 of the first terminal assembly 10a may not be connected to the first electromagnetic shielding member 103 of the second terminal assembly 10b, which would not be repeated herein.

In one embodiment, two opposite sides of the insulating body 102 in the second direction Y of each of the terminal assemblies 10 respectively comprise a first positioning part 1027. Two opposite sides of each of the accommodating grooves 121 in the second direction Y respectively comprise a second positioning part 1211. When each of the terminal assemblies 10 is disposed in the corresponding accommodating groove 121, each of the first positioning parts 1027 of the insulating body 102 would be connected with the corresponding second positioning part 1211 to position each of the terminal assemblies 10 in the corresponding accommodating groove 121. Specifically, the first positioning part 1027 is a dovetail bump and protrudes in the second direction Y. The second positioning part 1211 is a dovetail groove.

Referring to FIG. 1 again, in this embodiment, the electrical connector 1 further comprises a metal cover 14. The metal cover 14 is disposed on the housing 12 and covers the two terminal assemblies 10. The housing 12 comprises a first side surface 12a and two second side surfaces 12b. The first side surface 12a is in the first direction X and is opposite to the wiring opening 123. The two second side surfaces 12b are oppositely disposed in the second direction Y. The metal cover 14 comprises a first sidewall 14a and two second sidewalls 14b. The first sidewall 14a is in the first direction X. The two second sidewalls 14b are oppositely disposed in the second direction Y. When the metal cover 14 is disposed on the housing 12, the first sidewall 14a would correspond to the first side surface 12a, and the two second sidewalls 14b would correspond to the two second side surfaces 12b, respectively. In this embodiment, an end surface of the first sidewall 14a and the two second sidewalls 14b of the metal cover 14 close to the bottom surface of the housing 12 is coplanar with the bottom surface of the housing 12.

In one embodiment, the housing 12 comprises a plurality of first engaging parts 1212 respectively disposed on the peripheries of the two accommodating grooves 121. The metal cover 14 further comprises a plurality of second engaging parts 141. When the metal cover 14 is disposed on the housing 12, each of the first engaging parts 1212 would be engaged with the corresponding second engaging part 141. In this embodiment, the first engaging part 1212 is a bump and extends toward the metal cover 14. The second engaging part 141 is a hole. In other embodiments, the first engaging part 1212 is a hot-melt column. When the first engaging part 1212 is engaged with the second engaging part 141, the first engaging part 1212 is heated to melt, and the second engaging part 141 is sealed to secure the metal plate 14 onto the housing 12. The first side surface 12a of the housing 12 further comprises a third engaging part 1213 comprising a plurality of engaging blocks 12131 disposed at intervals. The first sidewall 14a of the metal cover 14 comprises a fourth engaging part 142 comprising a plurality of engaging notches 1421. A rib 1422 is provided between two adjacent engaging notches 1421. When the metal cover 14 is disposed on the housing 12, each of the engaging blocks 12131 would be disposed in the corresponding engaging notch 1421, and each of the ribs 1422 would be disposed between two adjacent engaging blocks 12131 to position the metal cover 14 on the housing 12. In this embodiment, each of the engaging blocks 12131 is disposed between two adjacent ground terminals 101b, each of the ribs 1422 corresponds to the ground terminal 101b, and an end surface of each of the ribs 1422 close to the bottom surface of the housing 12 is coplanar with the bottom surface of the housing 12.

Referring to FIG. 3 again, in this embodiment, the electrical connector 1 further comprises an insulative covering body 15. The insulative covering body 15 is disposed between the housing 12 and the metal cover 14 and covers the two terminal assemblies 10. The insulative covering body 15 separates the two terminal assemblies 10 and the metal cover 14 to prevent the metal cover 14 from contacting with the two terminal assemblies 10. The metal cover 14 further comprises a plurality of through holes 143. When the metal cover plate 14 is disposed on the housing 12, an insulative plastic would be poured into a space between the two terminal assemblies 10 and the metal cover 14 through the through hole 143. In one embodiment, the insulative plastic could be poured into the space between the two terminal assemblies 10 and the metal cover 14 through the wiring opening 123 of the housing 12. When the insulative plastic comprises solidified, the insulative covering body 15 would be formed between the two terminal assemblies 10 and the metal cover 14.

In this embodiment, the electrical connector further comprises a sideboard 16. The sideboard 16 is disposed on the housing 12 and on the metal cover plate 14 and covers the wiring opening 123. The sideboard 16 is formed by pouring insulative plastic into a fixture, indicating that the sideboard 16 covers the plurality of cables 11. An end surface of the sideboard 16 close to the bottom surface of the housing 12 is coplanar with the bottom surface of the housing 12.

Figure 15:
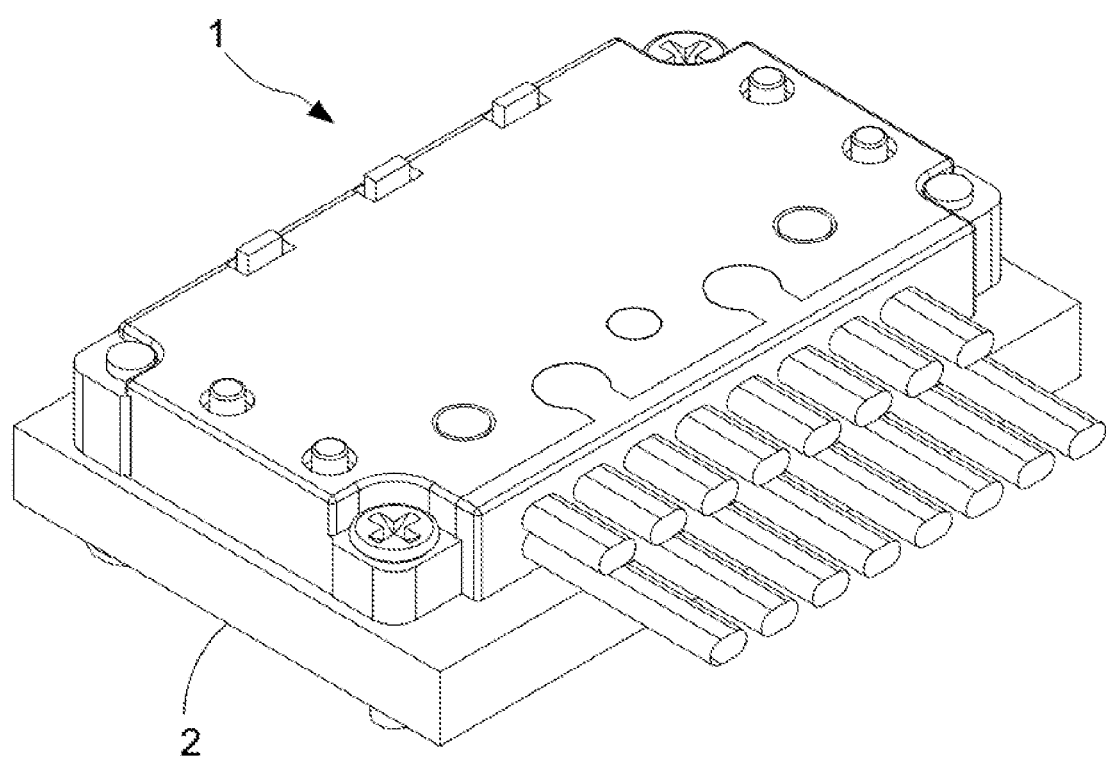
FIG. 15 is a use state diagram of the electrical connector of the first embodiment of the present disclosure.
Figure 16:
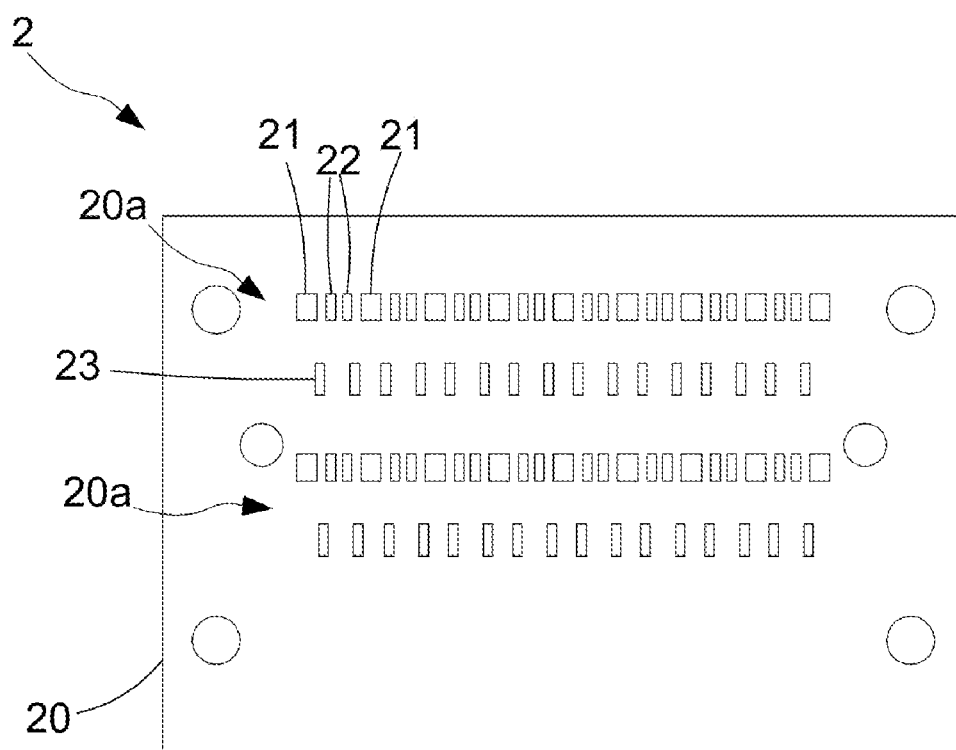
FIG. 16 is a schematic diagram of a mating connector of the first embodiment of the present disclosure.
Figure 16:
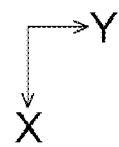

FIG. 15 is a use state diagram of the electrical connector of the first embodiment of the present disclosure. FIG. 16 is a schematic diagram of a mating connector of the first embodiment of the present disclosure. As shown in the figures, the electrical connector 1 of the above embodiment is a cable connector. When the electrical connector 1 of this embodiment is in use, the electrical connector 1 would be mated with a mating connector (electrical connector). In this embodiment, the mating connector (electrical connector) 2 comprises a circuit board 20. A surface of the circuit board 20 comprises two electrical connecting areas 20a. Since the two terminal assemblies 10 of the electrical connector 1 are electrically connected with the corresponding electrical connecting area 20a respectively, the two electrical connecting areas 20a of this embodiment are disposed on a surface where the circuit board 20 and the electrical connector 1 mate along the first direction X. Each of the electrical connecting areas 20a comprises a plurality of ground conductive pads 21, a plurality of signal conductive pads 22, and a plurality of shielding ground conductive pads 23. The plurality of ground conductive pads 21 and the plurality of signal conductive pads 22 are arranged in a row at intervals along the second direction Y. The plurality of ground conductive pads 21 and the plurality of signal conductive pads 22 are alternately arranged. At least one signal conductive pad 22 is provided between two adjacent ground conductive pads 21. In this embodiment, two signal conductive pads 22 are provided between two adjacent ground conductive pads 21. The plurality of ground conductive pads 21 respectively correspond to the plurality of contacting elastic pieces of the plurality of ground terminals of the terminal assembly. The plurality of signal conductive pads 22 respectively correspond to the plurality of contacting elastic pieces of the plurality of signal terminals of the terminal assembly. In this way, the distance between a centerline of each of the signal conductive pads 22 and a centerline of the adjacent ground conductive pad 21 is greater than the distance between the centerline of each of the signal conductive pads 22 and the centerline of the adjacent signal conductive pad 22. The width of each of the ground conductive pads 21 in the second direction Y is wider than the width of each of the signal conductive pads 22 in the second direction Y. The plurality of shielding ground conductive pads 23 are arranged in a row at intervals along the second direction Y and are disposed on one side of the plurality of ground conductive pads 21 and the plurality of signal conductive pads 22 which are arranged in a row. Each of the shielding ground conductive pads 23 corresponds to the plurality of ground elastic pieces of each of the second electromagnetic shielding members. Each of the shielding ground conductive pads 23 corresponds to a gap between the adjacent ground conductive pad 21 and the signal conductive pad 22.

When the electrical connector 1 is connected to the circuit board 20 of the mating connector 2, an end surface of the housing 12, an end surface of the metal cover 14, and an end surface of the sideboard 16 of the electrical connector 1 would be in contact with a surface of the circuit board 20. The contacting elastic piece of each of the signal terminals of each of the terminal assemblies of the electrical connector 1 is connected with the corresponding signal conductive pad 22. The contacting elastic piece 10112 of each of the ground terminals 101*b* is connected with the corresponding ground conductive pad 21. The ground elastic piece 1045 of the second electromagnetic shielding member 104 is connected with the corresponding shielding ground conductive pad 23. The connection described above refers to contact connection or non-contact connection. In this embodiment, the circuit board 20 surrounds the two signal conductive pads 22 through two ground conductive pads 21 and two shielding ground conductive pads 23. When each of the ground conductive pads 21 is contactingly connected to the corresponding ground terminal and when the two shielding ground conductive pads 23 are contactingly connected to the corresponding second electromagnetic shielding member 104, the two grounding conductive pads 21 and the two shielding ground conductive pads 23 would be grounded to reduce the interference from external electromagnetic to the signal transmission between the signal terminal and the circuit board 20, and to prevent two adjacent differential signal pairs from interfering with the circuit board 20 during signal transmission. In this way, the electromagnetic shielding performance between the circuit board 20 and the electrical connector 1 can be improved, performing excellent signal transmission between the circuit board 20 and the electrical connector 1.

Figure 17:
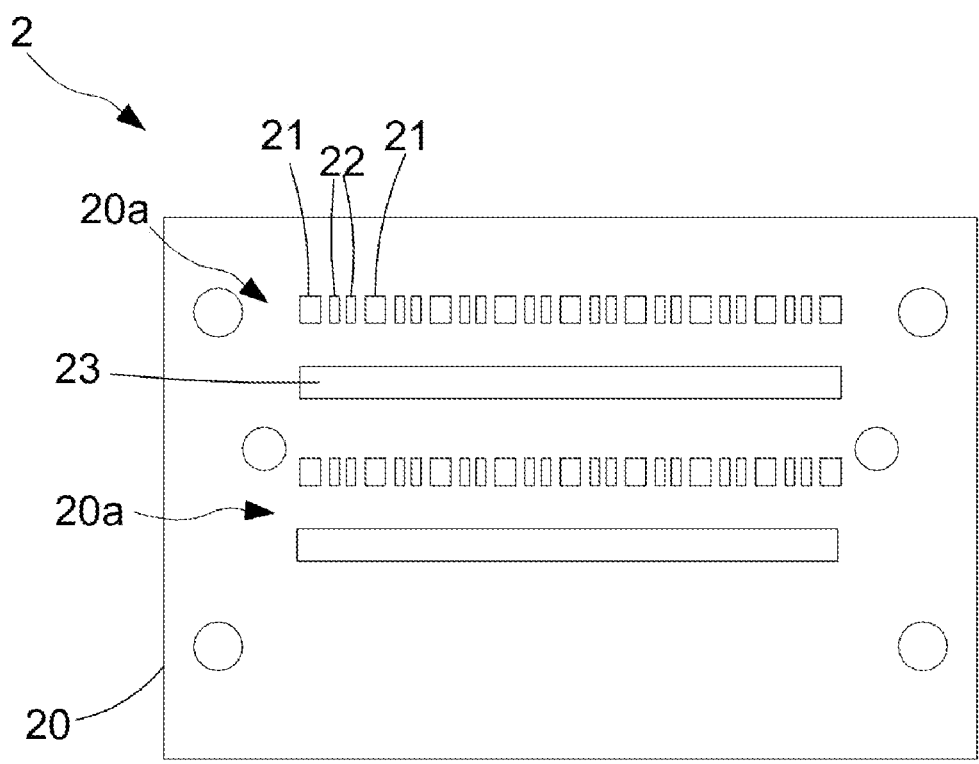
FIG. 17 is a schematic diagram of a mating connector of the second embodiment of the present disclosure.

FIG. 17 is a schematic diagram of a mating connector of the second embodiment of the present disclosure. As shown in the figure, the mating connector 2 of this embodiment is different from that of the first embodiment in that the mating connector 2 comprises only one shielding ground conductive pad 23 extending in a second direction Y. That is, the plurality of shielding ground conductive pads of the circuit board of the first embodiment are connected in series, and the shielding ground conductive pad 23 corresponds to a plurality of ground elastic pieces. In this embodiment, two adjacent signal conductive pads 22 are disposed between two adjacent ground conductive pads 21 and the shielding ground conductive pad 23 to increase the range that the two adjacent ground conductive pads 21 and the shielding ground conductive pad 23 surround the two adjacent signal conductive pads 22. Thus, the electromagnetic shielding performance between the circuit board 20 and the electrical connector can be improved, performing excellent signal transmission between the circuit board 20 and the electrical connector.

Figure 18:
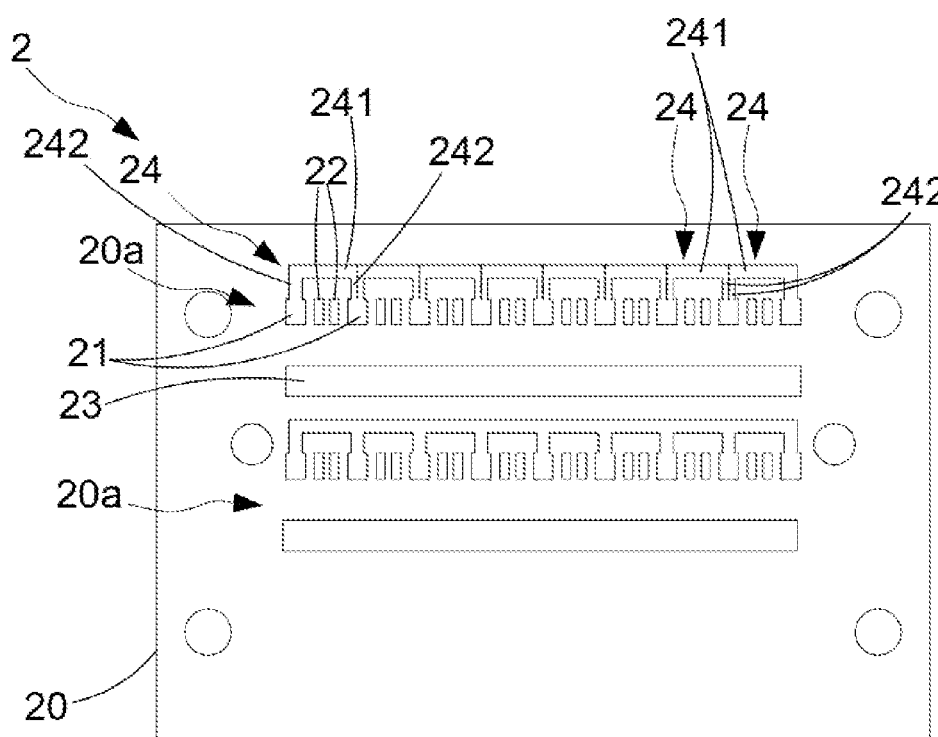
FIG. 18 is a schematic diagram of a mating connector of the third embodiment of the present disclosure.

FIG. 18 is a schematic diagram of a mating connector of the third embodiment of the present disclosure. As shown in the figure, the mating connector 2 of this embodiment is different from that of the first embodiment in that the plurality of ground conductive pads 21 of the circuit board 20 are connected in series. Specifically, the circuit board 20 of this embodiment further comprises a plurality of first conductive connecting pads 24 disposed on a surface of the electrical connecting area 20*a* of the circuit board 20. Two ends of each of the first conductive connecting pads 24 are respectively connected with the corresponding ground conductive pad 21. One ends of two adjacent first conductive connecting pads 24 are connected with the same ground conductive pad 21. Each of the first conductive connecting pads 24 is disposed on one side of each of the signal conductive pads 22 away from the shielding ground conductive pad 23. The gap between the two ends of each of the first conductive connecting pads 24 corresponds to at least one signal conductive pad 22. In this embodiment, two ends of each of the first conductive connecting pads 24 are connected with two adjacent ground conductive pads 21. The gap between two ends of each of the first conductive connecting pads 24 corresponds to two signal conductive pads 22 and is disposed on one side of the two signal conductive pads 22 between two adjacent ground conductive pads 21 away from the shielding ground conductive pad 23. The plurality of first conductive connecting pads 24 are arranged along the second direction Y, wherein one ends of two adjacent first conductive connecting pads 24 are connected with the same ground conductive pad 21. In this way, the plurality of ground conductive pads 21 can be interconnected through the plurality of first conductive connecting pads 24.

In this embodiment, the first conductive connecting pad 24 comprises a first connecting body 241 and two second connecting bodies 242. The first connecting body 241 extends along the second direction Y, and the two second connecting bodies 242 are respectively disposed at two opposite ends of the two first connecting bodies 241 in the second direction Y. The two second connecting bodies 242 extend along the first direction X and are respectively connected with the corresponding shielding ground conductive pad 23. In this embodiment, two adjacent signal conductive pads 22 are disposed between the two adjacent ground conductive pads 21, the first conductive connecting pad 24, and the shielding ground conductive pad 23 to increase the range that the two adjacent ground conductive pads 21, the first conductive connecting pad 24, and the shielding ground conductive pad 23 surround the two adjacent signal conductive pads 22. In this way, the electromagnetic shielding between the electrical connector and the circuit board 20 can be improved, performing excellent signal transmission between the circuit board 20 and the electrical connector. In this embodiment, the plurality of first conductive connecting pads 24 are connected in series. Thus, each of the second connecting bodies 242 of each of the first conductive connecting pads 24 is connected with the second connecting body 242 of the adjacent first conductive connecting pad 24. The plurality of first connecting bodies 241 are interconnected.

Figure 19:
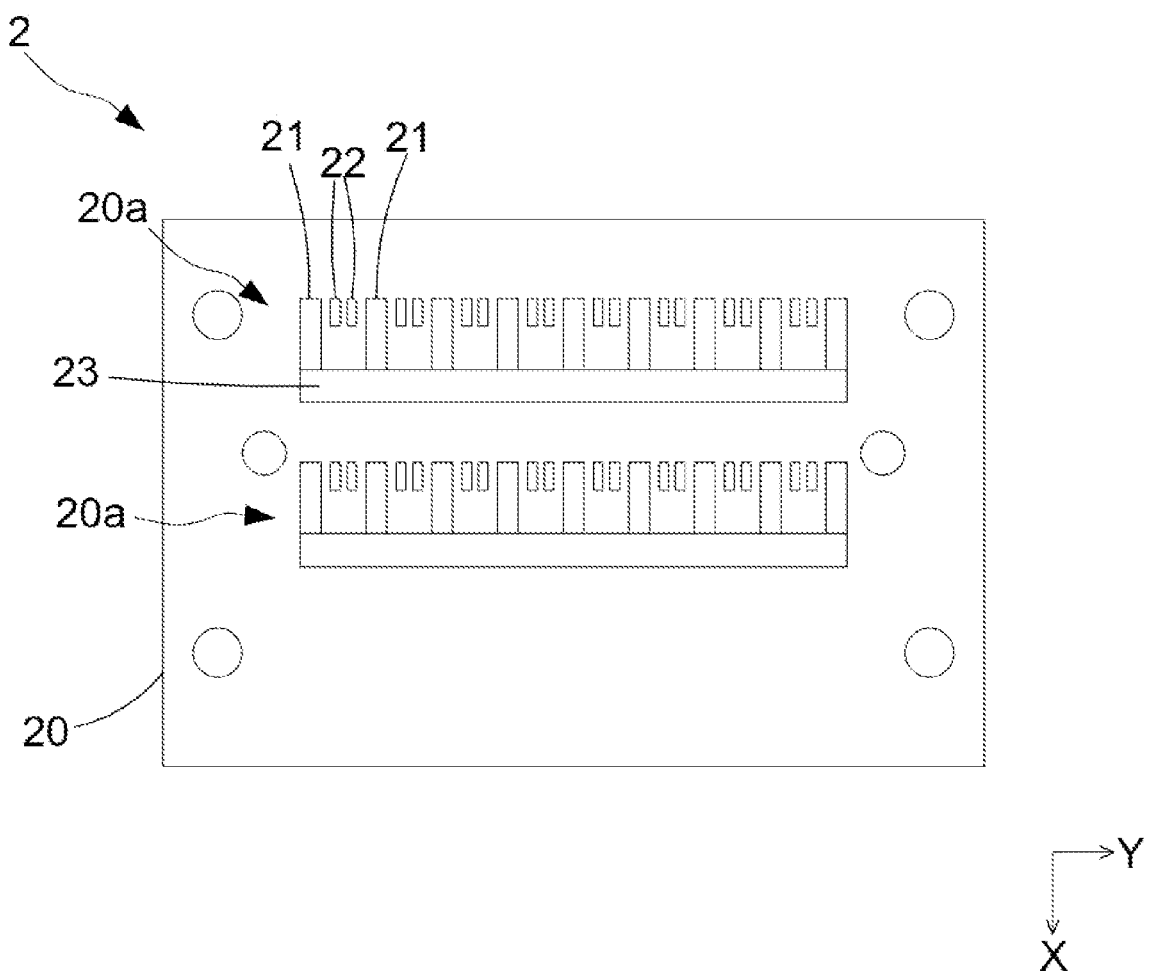
FIG. 19 is a schematic diagram of a mating connector of the fourth embodiment of the present disclosure.

FIG. 19 is a schematic diagram of a mating connector of the fourth embodiment of the present disclosure. As shown in the figure, the mating connector 2 of this embodiment is different from that of the second embodiment in that the plurality of ground conductive pads 21 respectively extend toward the shielding ground conductive pad 23 and are connected with the shielding ground conductive pad 23. Two adjacent ground conductive pads 21 and the shielding ground conductive pad 23 form a U-shaped semi-open area. Two signal conductive pads 22 between two adjacent ground conductive pads 21 are disposed in the U-shaped semi-open area to increase the range that the two adjacent ground conductive pads 21 and the shielding ground conductive pad 23 surround two adjacent signal conductive pads 22. Thus, the electromagnetic shielding performance between the circuit board 20 and the electrical connector can be improved, performing excellent signal transmission between the circuit board 20 and the electrical connector. In this embodiment, the length of each of the ground conductive pads 21 in the first direction X can be extended to be directly connected to the shielding ground conductive pad 23. Each of the ground conductive pads 21 can also be connected to the shielding ground conductive pad 23 by connecting with the conductive pad.

Figure 20:
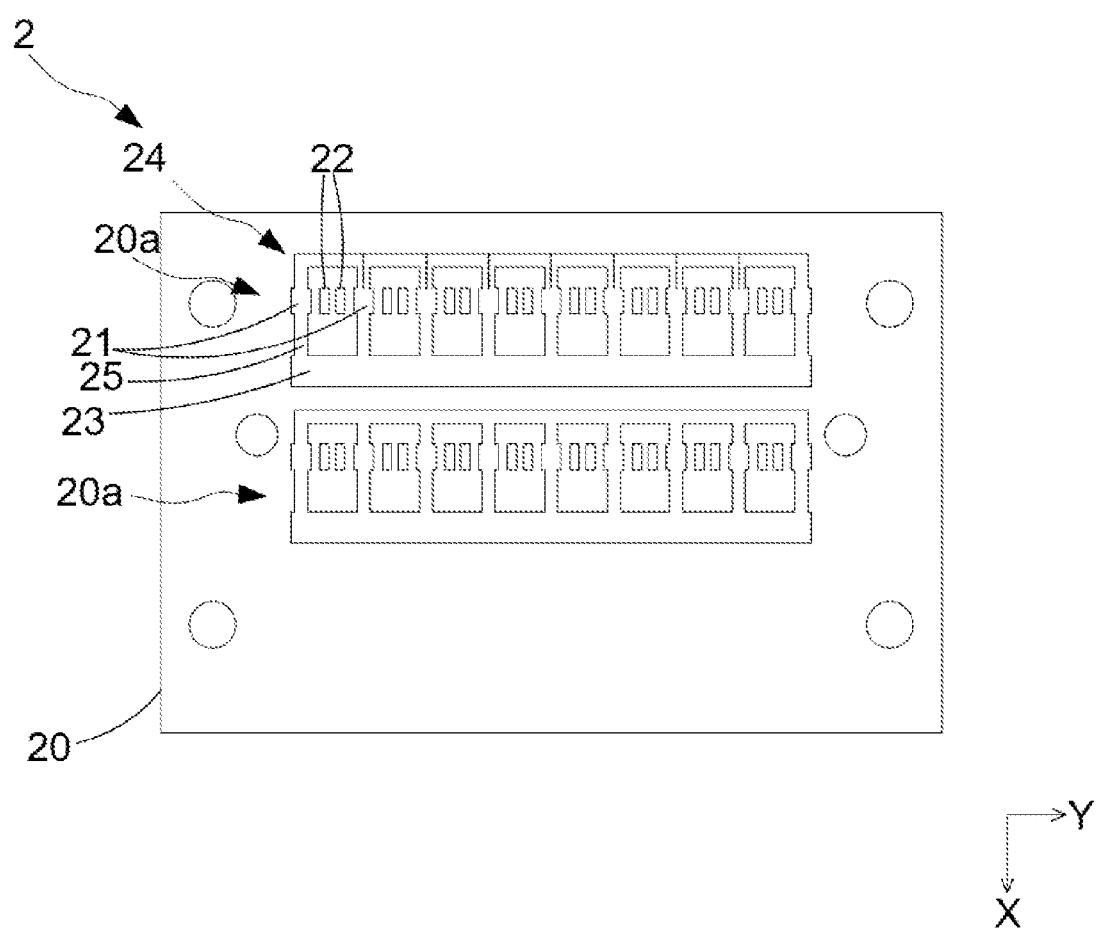
FIG. 20 is a schematic diagram of a mating connector of the fifth embodiment of the present disclosure.

FIG. 20 is a schematic diagram of a mating connector of the fifth embodiment of the present disclosure. As shown in the figure, the mating connector 2 of this embodiment is different from that of the third embodiment in that each of the ground conductive pads 21 of this embodiment is connected to a shielding ground conductive pad 23 through a second conductive connecting pad 25. Each of the second conductive connection pads 25 is disposed on a surface of the electrical connecting area 20a of the circuit board 20. Two ends of each of the second conductive connecting pads 25 are respectively connected with the corresponding ground conductive pad 21 and the shielding ground conductive pad 23. Each of the first conductive connecting pads 24, two adjacent ground conductive pads 21, two adjacent second conductive connecting pads 25, and the shielding ground conductive pad 23 form an enclosed area. The two signal conductive pads 22 between the two adjacent ground conductive pads 21 are disposed in the enclosed area, which improves the electromagnetic shielding between the circuit board 20 and the electrical connector, performing excellent signal transmission between the circuit board 20 and the electrical connector.

Figure 21:
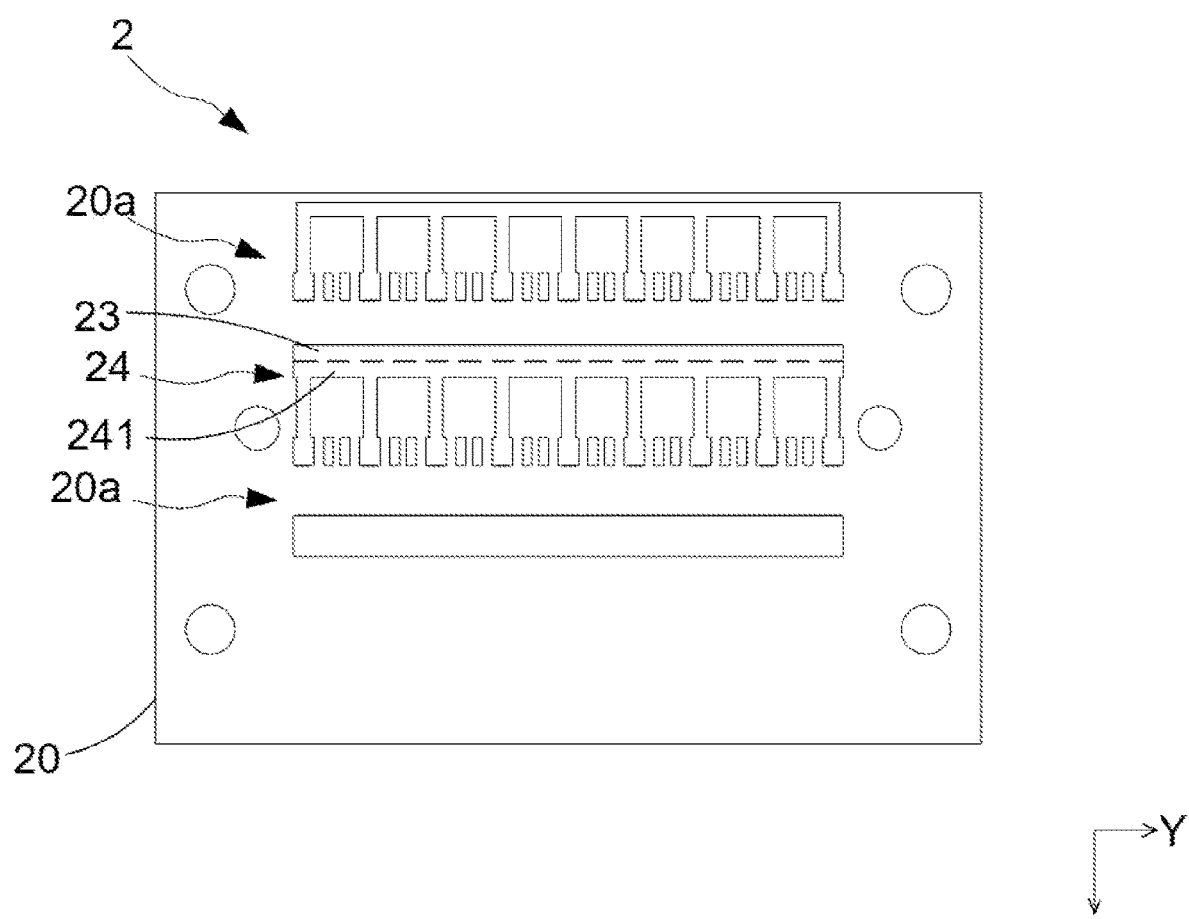
FIG. 21 is a schematic diagram of a mating connector of the sixth embodiment of the present disclosure.

FIG. 21 is a schematic diagram of a mating connector of the sixth embodiment of the present disclosure. As shown in the figure, the mating connector 2 of this embodiment is different from that of the second embodiment in that the plurality of first conductive connecting pads 24 of one electrical connection area 20a are connected with a shielding ground conductive pads 23 of an adjacent electrical connection area 20a. Specifically, the first connecting body 241 of each of the first conductive connecting pads 24 is connected with the shielding ground conductive pad 23. In this embodiment, the plurality of conductive pads for grounding of the two electrical connecting areas 20a are partially connected. Thus, the electromagnetic shielding performance between the circuit board 20 and the electrical connector can be improved, performing excellent signal transmission between the circuit board 20 and the electrical connector.

Figure 22:
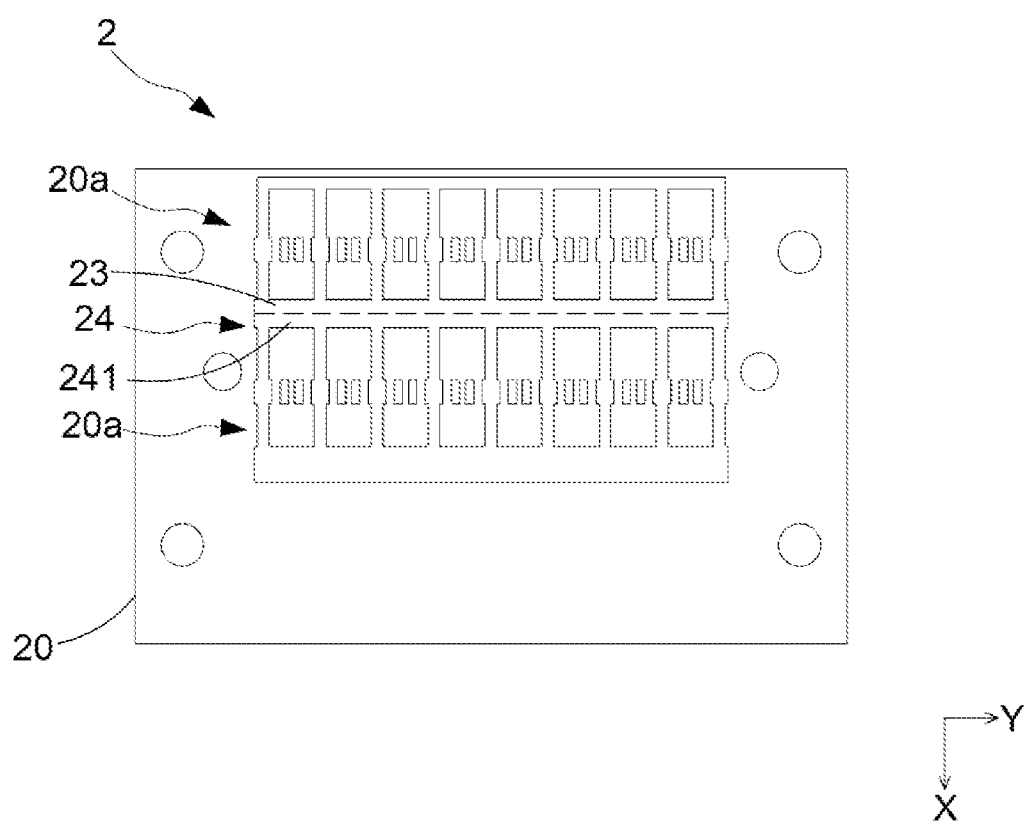
FIG. 22 is a schematic diagram of a mating connector of the seventh embodiment of the present disclosure.

FIG. 22 is a schematic diagram of a mating connector of the seventh embodiment of the present disclosure. As shown in the figure, the mating connector 2 of this embodiment is different from that of the fifth embodiment in that a plurality of first conductive connecting pads 24 in one electrical connecting area 20a are connected with a shielding ground conductive pad 23 of an adjacent electrical connecting area 20a. Specifically, the first connecting body 241 of each of the first conductive connecting pads 24 is connected to the shielding ground conductive pad 23. In this embodiment, the plurality of conductive pads for grounding of the two electrical connecting areas 20a are integrally connected to be one piece. Thus, the electromagnetic shielding performance between the circuit board 20 and the electrical connector can be improved, performing excellent signal transmission between the circuit board 20 and the electrical connector.

Figure 23:
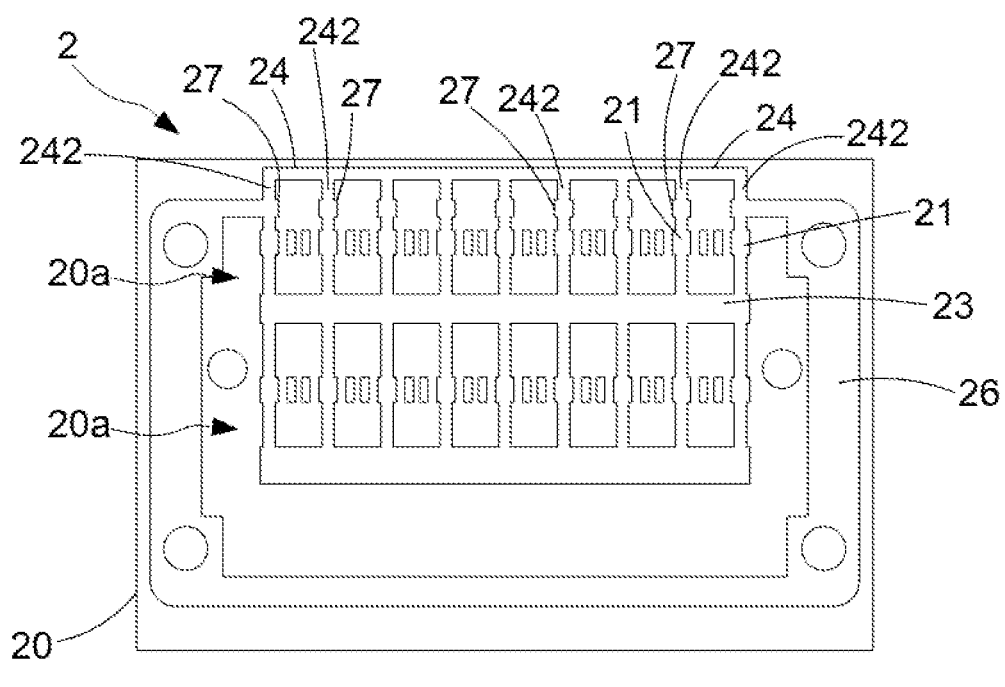
FIG. 23 is a schematic diagram of a mating connector of the eighth embodiment of the present disclosure.

FIG. 23 is a schematic diagram of a mating connector of the eighth embodiment of the present disclosure. As shown in the figure, the mating connector 2 of this embodiment is different from that of the seventh embodiment in that the mating connector 2 further comprises a first cover ground conductive pad 26. The first cover ground conductive pad 26 is disposed on a surface of the circuit board 20 and surrounds the electrical connecting area 20a. In this embodiment, the first cover ground conductive pad 26 surrounds the two electrical connecting areas 20a. The first cover ground conductive pad 26 corresponds to a metal cover and a sideboard of the electrical connector, so the first cover ground conductive pad 26 is a framed body. Two ends of the first cover ground conductive pad 26 are respectively connected with the corresponding first conductive connecting pad 24 in an electrical connecting area 20a, so that the first cover ground conductive pad 26, a plurality of ground conductive pads 21, and a plurality of shielding ground conductive pads 23 are connected in series. In this embodiment, when the circuit board 20 is connected to the electrical connector of the first embodiment, a plurality of ground terminals would be contactingly connected to a plurality of ground conductive pads 21. A plurality of ground elastic pieces of each of the second electromagnetic shielding members are contactingly connected with the corresponding shielding grounding conductive pad 23. The metal cover and the sideboard are contactingly connected to the first cover ground conductive pad 26. In this way, any external electromagnetic would be completely blocked without entering the gap between the electrical connector and the circuit board 20, and the electromagnetic between the electrical connector and the circuit board 20 can also be blocked without being leaked. Thus, when signal is transmitted between the circuit board 20 and the electrical connector, excellent signal transmission would be performed. In this embodiment, the first cover ground conductive pad 26 can be applied to the mating connector of the third embodiment. The first cover ground conductive pad 26 can be only connected with a plurality of ground conductive pads 21 in one of the two electrical connecting areas 20a in series. In this embodiment, the first cover ground conductive pad 26 can be applied to the mating connector of the fifth embodiment. The first cover ground conductive pad 26 can be only connected with a plurality of ground conductive pads 21 and a shielding ground conductive pad 23 in one of the two electrical connecting areas 20a in series. In this embodiment, the first cover ground conductive pad 26 can be applied to the mating connector of the sixth embodiment. The first cover ground conductive pad 26 can be only connected with a plurality of ground conductive pads 21 in series to integrally form a one piece element. In other words, the first cover ground conductive pad 26 can be optionally connected with a plurality of ground conductive pads 21 or shielding ground conductive pads 23 in series to integrally form a one piece element, or the first cover ground conductive pad 26 can be connected with a plurality of ground conductive pads 21 and a shielding ground conductive pads 23 in series to integrally form a one piece. In other embodiments, the first cover ground conductive pad 26 may not be connected with the plurality of ground conductive pads 21 and the plurality of shielding ground conductive pads 23 in series to integrally form a one piece. That is, the first cover ground conductive pad 26 is individually disposed and is not connected with the first conductive connecting pad 24.

In one embodiment, referring to FIG. 1, an end surface of each of the ribs 1422 of the metal cover 14 close to the bottom surface of the housing 12 is directly connected to the second connecting body 242 of the corresponding first conductive connecting pad 24. In other embodiments, the circuit board 20 further comprises a plurality of second cover ground conductive pads 27 respectively disposed on the corresponding second connecting bodies 242. The end surface of each of the ribs 1422 of the metal cover 14 close to the bottom surface of the housing 12 is directly connected to the corresponding second cover ground conductive pad 27. The width of each of the second cover ground conductive pads 27 in the second direction Y is wider than the width of the second connecting body 242 in the second direction Y to ensure that the end surface of each of the ribs 1422 of the metal cover 14 close to the bottom surface of the housing 12 can be effectively connected to the corresponding second cover ground conductive pad 27. In other embodiments, two ends of the first cover ground conductive pad 26 are respectively connected to the corresponding second cover ground conductive pad 27.

In summary, embodiments of the present disclosure provide an electrical connector. By disposing the ground conductive pad on the circuit board, the electromagnetic shielding member of the cable connector would be connected to the shielding ground conductive pad of the circuit board when the electrical connector is connected with the cable connector. Thus, the crosstalk among the plurality of signal terminals transmitting signals between the electrical connector and the mating connector can be avoided to effectively improve the signal transmission performance of electrical connectors. Meanwhile, the configuration of the plurality of ground conductive pads and shielding ground conductive pads can also be fine-tuned. The plurality of signal conductive pads could be divided into multiple areas through the plurality of ground conductive pads and the shielding ground conductive pads so that the plurality of signal conductive pads in each area could be connected with the plurality of signal terminals of the cable connector. When the electrical connector and the cable connector perform signal transmission, it is possible to avoid crosstalking between the electrical connector and the cable connector to effectively improve the signal transmission performance of the electrical connector. Besides, the present disclosure additionally provides first cover ground conductive pad, which keeps the external electromagnetics from entering the gap between the electrical connector and the cable connector by contacting with the metal cover of the cable connector when the electrical connector and the cable connector are performing signal transmission. In this way, the overall electromagnetic shielding performance can be increased to improve the overall signal transmission performance.

It is to be understood that the term "comprises", "comprising", or any other variants thereof, is intended to encompass a non-exclusive inclusion, such that a process, method, article, or device of a series of elements not only comprise those elements but further comprises other elements that are not explicitly listed, or elements that are inherent to such a process, method, article, or device. An element defined by the phrase "comprising a . . . " does not exclude the presence of the same element in the process, method, article, or device that comprises the element.

Although the present disclosure has been explained in relation to its preferred embodiment, it does not intend to limit the present disclosure. It will be apparent to those skilled in the art having regard to this present disclosure that other modifications of the exemplary embodiments beyond those embodiments specifically described here may be made without departing from the spirit of the disclosure. Accordingly, such modifications are considered within the scope of the disclosure as limited solely by the appended claims.

What is claimed is:

1. An electrical connector connected with a cable connector, the cable connector comprising a plurality of ground terminals, a plurality of signal terminals and an electromagnetic shielding member, the electrical connector comprising:
   a circuit board comprising an electrical connecting area;
   a plurality of ground conductive pads disposed on a surface of the electrical connecting area of the circuit board at intervals, each of the ground conductive pads being connected with the corresponding ground terminal;
   a plurality of signal conductive pads disposed on the surface of the electrical connecting area of the circuit board at intervals, at least one signal conductive pad being disposed between two adjacent ground conductive pads, each of the signal conductive pads being connected with the corresponding signal terminal; and
   a shielding ground conductive pad, the shielding ground conductive pad being disposed on the surface of the electrical connecting area of the circuit board and being disposed on one side of the plurality of ground conductive pads and away from one side of the cable connector that is near to the plurality of ground conductive pads, the shielding ground conductive pad being connected with the electromagnetic shielding member;
   wherein the plurality of ground conductive pads are integrally connected in series into one piece;
   wherein the electrical connector comprising a plurality of first conductive connecting pads disposed on the surface of the electrical connecting area of the circuit board, two ends of each of the first conductive connecting pads being respectively connected with the corresponding ground conductive pad, one end of each two adjacent first conductive connecting pads being simultaneously connected with the same ground conductive pad, each of the first conductive connecting pads being disposed on one side of the signal conductive pad away from the shielding ground conductive pad.

2. The electrical connector according to claim 1, wherein the number of shielding ground conductive pads can be multiple; the plurality of shielding ground conductive pads are disposed on the surface of the electrical connecting area of the circuit board at intervals.

3. The electrical connector according to claim 2, wherein each of the shielding ground conductive pads corresponds to a gap between the adjacent ground conductive pad and the signal conductive pad.

4. The electrical connector according to claim 1, wherein a gap between two ends of each of the first conductive connecting pads corresponds to at least one of the signal conductive pads.

5. The electrical connector according to claim 1, wherein two ends of each of the first conductive connecting pads are respectively connected with two adjacent ground conductive pads.

6. The electrical connector according to claim 1, wherein the plurality of first conductive connecting pads are integrally connected in series into one piece.

7. The electrical connector according to claim 1, wherein each of the ground conductive pads is connected with the shielding ground conductive pad.

8. The electrical connector according to claim 7 comprising a plurality of second conductive connecting pads, each of the second conductive connecting pads being connected with the corresponding ground conductive pad and the shielding ground conductive pad.

9. The electrical connector according to claim 1, wherein the number of electrical connecting areas is two; the two electrical connecting areas are arranged side by side; the plurality of first conductive connecting pads of one of the two electrical connecting areas are connected with the shielding ground conductive pad of the other electrical connecting area.

10. The electrical connector according to claim 1, wherein each of the ground conductive pads is connected with the shielding ground conductive pad.

11. The electrical connector according to claim 10 comprising a plurality of second conductive connecting pads disposed on the surface of the electrical connecting area of the circuit board, each of the second conductive connecting pads being connected with the corresponding ground conductive pad and the shielding ground conductive pad.

12. The electrical connector according to claim 1, wherein the metal cover of the cable connector comprises a plurality of ribs respectively connected with the corresponding first conductive connecting pad.

13. The electrical connector according to claim 12 comprising a plurality of second cover ground conductive pads respectively connected with the corresponding first conductive connecting pad, each of the second cover ground conductive pads being connected with the corresponding rib.

14. An electrical connector connected with a cable connector, the cable connector comprising a plurality of ground terminals, a plurality of signal terminals and an electromagnetic shielding member, the electrical connector comprising:
a circuit board comprising an electrical connecting area;
a plurality of ground conductive pads disposed on a surface of the electrical connecting area of the circuit board at intervals, each of the ground conductive pads being connected with the corresponding ground terminal;
a plurality of signal conductive pads disposed on the surface of the electrical connecting area of the circuit board at intervals, at least one signal conductive pad being disposed between two adjacent ground conductive pads, each of the signal conductive pads being connected with the corresponding signal terminal;
a shielding ground conductive pad, the shielding ground conductive pad being disposed on the surface of the electrical connecting area of the circuit board and being disposed on one side of the plurality of ground conductive pads and away from one side of the cable connector that is near to the plurality of ground conductive pads, the shielding ground conductive pad being connected with the electromagnetic shielding member; and
a first cover ground conductive pad, the first cover ground conductive pad being disposed on a surface of the circuit board and surrounding the electrical connecting area, the first cover ground conductive pad being connected with a metal cover of the cable connector.

15. The electrical connector according to claim 14, wherein the first cover ground conductive pad is integrally connected with the plurality of ground conductive pads in series into one piece.

16. The electrical connector according to claim 14, wherein the first cover ground conductive pad is integrally connected with the shielding ground conductive pad in series into one piece.

17. The electrical connector according to claim 14, wherein the first cover ground conductive pad is integrally connected with the plurality of ground conductive pads and the shielding ground conductive pad in series into one piece.

* * * * *